United States Patent [19]

Schmitz et al.

[11] Patent Number: 5,447,570

[45] Date of Patent: Sep. 5, 1995

[54] PURGE GAS IN WAFER COATING AREA SELECTION

[75] Inventors: Johannes J. Schmitz, Sunnyvale; Frederick J. Scholz, Fremont, both of Calif.; Norman L. Turner, Gloucester, Mass.; Raymond L. Chow, Cupertino, Calif.; Frank O. Uher, Los Altos, Calif.; Sien G. Kang, Tracy, Calif.; Steven C. Selbrede, San Jose, Calif.

[73] Assignee: Genus, Inc., Sunnyvale, Calif.

[21] Appl. No.: 902,995

[22] Filed: Jun. 23, 1992

Related U.S. Application Data

[63] Continuation-in-part of Ser. No. 812,734, Dec. 23, 1991, abandoned, which is a continuation-in-part of Ser. No. 596,512, Oct. 12, 1991, Pat. No. 5,094,885, and a continuation-in-part of Ser. No. 512,809, Apr. 23, 1990, abandoned.

[51] Int. Cl.⁶ ............................................. C23C 16/00
[52] U.S. Cl. ..................................... 118/728; 118/715; 118/725
[58] Field of Search .................... 118/715, 725, 728

[56] References Cited

U.S. PATENT DOCUMENTS

| | | | |
|---|---|---|---|
| 4,457,359 | 7/1984 | Holden | 118/728 |
| 4,724,621 | 2/1988 | Hobson | 118/725 |
| 4,801,352 | 1/1989 | Piwczyk | 118/729 |
| 4,911,103 | 3/1990 | Davis | 118/728 |
| 4,990,374 | 2/1991 | Keeley | 118/715 |
| 5,000,113 | 3/1991 | Wang | 118/715 |
| 5,033,407 | 7/1991 | Mizuno | 118/715 |
| 5,094,885 | 3/1992 | Selbrede | 118/728 |
| 5,133,284 | 7/1992 | Thomas | 118/725 |
| 5,230,741 | 7/1993 | van de Ven | 118/728 |

FOREIGN PATENT DOCUMENTS 3633386 4/1988 Germany.

OTHER PUBLICATIONS

Winkler, "Novellas Enters Tungsten CVD" Electronics News, Sep. 17, 1990.
Solid State Technology, "Tungsten Exclusion Ring Controls Deposition Area", p. 30, Aug. 1991.

*Primary Examiner*—Richard Bueker
*Attorney, Agent, or Firm*—Donald R. Boys

[57] ABSTRACT

Apparatus including a support and purge gas supply prevents edge and backside coating on a wafer in manufacture of integrated circuits. Various enclosure elements and methods are disclosed for containing and directing purge gas, and a CVD system is provided incorporating the elements of the invention.

33 Claims, 20 Drawing Sheets

Process Optimization for Blanket Tungsten Process

Wafer Temperature Vs. Argon Backside Flow
S/N 144
Pressure = 6.5 Torr

Wafer Temperature Vs. Argon Backside Flow
S/N 144
Pressure = 30 Torr

BASELINE 30 TORR PROCESS

Probe: 49 Points
Test Diameter: 4.92 Inches
Backside Flow: 300 sccm Argon
Substrate: TiW/Si

| Run # | Sheet Res. (mΩ/sq.) (6 Wafers) | Uniformity (1 s) (%) (6 Wafers) |
|---|---|---|
| 63 | 84 ± 5% | 2.8 ± 0.5 |
| 65 | 84 ± 5% | 2.7 ± 0.5 |
| 67 | 83 ± 5% | 2.8 ± 0.6 |
| 69 | 84 ± 5% | 2.7 ± 0.6 |
| 71 | 84 ± 5% | 2.8 ± 0.6 |
| 73 | 83 ± 5% | 3.0 ± 0.3 |
| 75 | 83 ± 5% | 3.1 ± 0.4 |
| 77 | 83 ± 5% | 3.0 ± 0.4 |
| Mean | 84 mΩ/sq. ± 6% | 2.9 ± 0.5% |

In wafer uniformity : ± 2.9%  (one sigma)
wafer to wafer : ± 6%  (hi-lo/avg)
run to run : ± 0.5%  (hi-lo/avg)

NOTE: Reactor not optimized wafer-to-wafer

Fig. 10

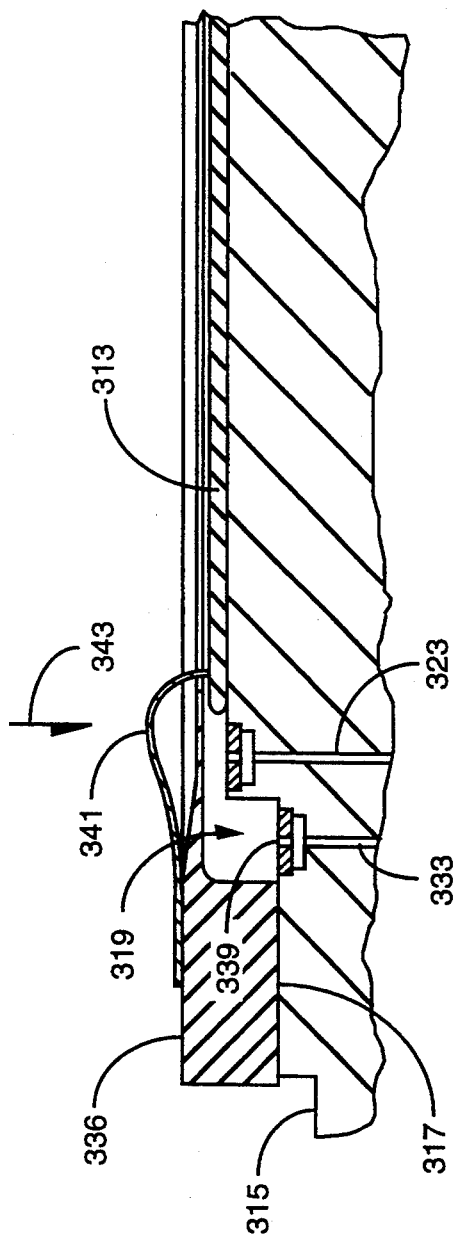
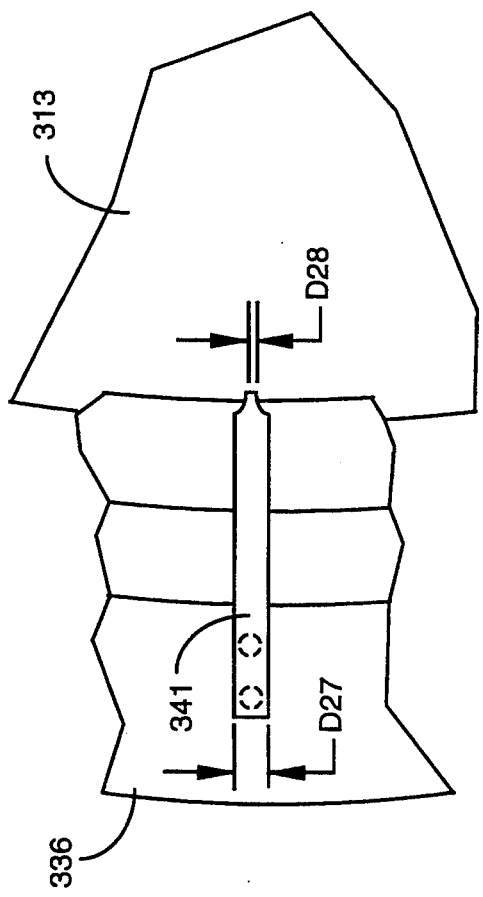

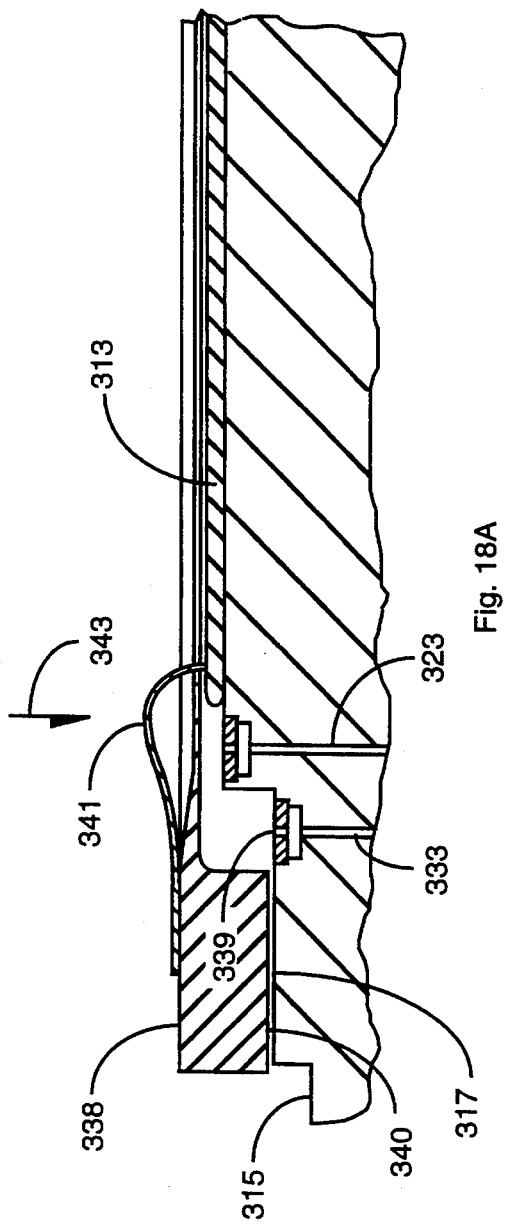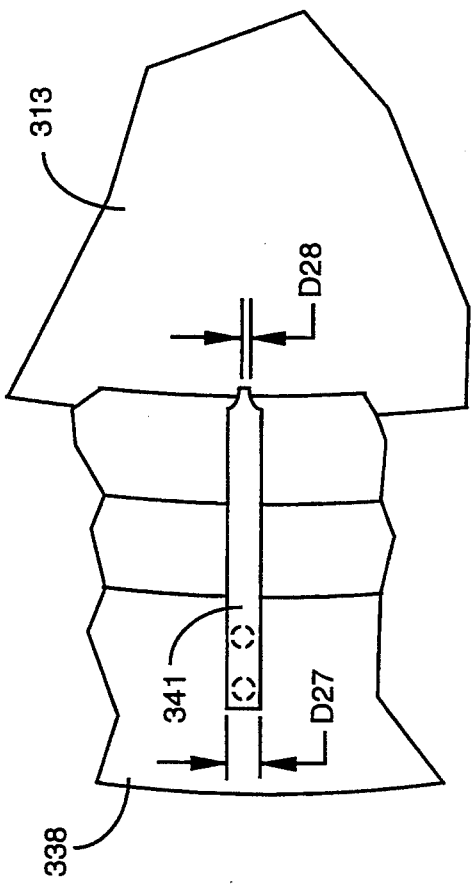

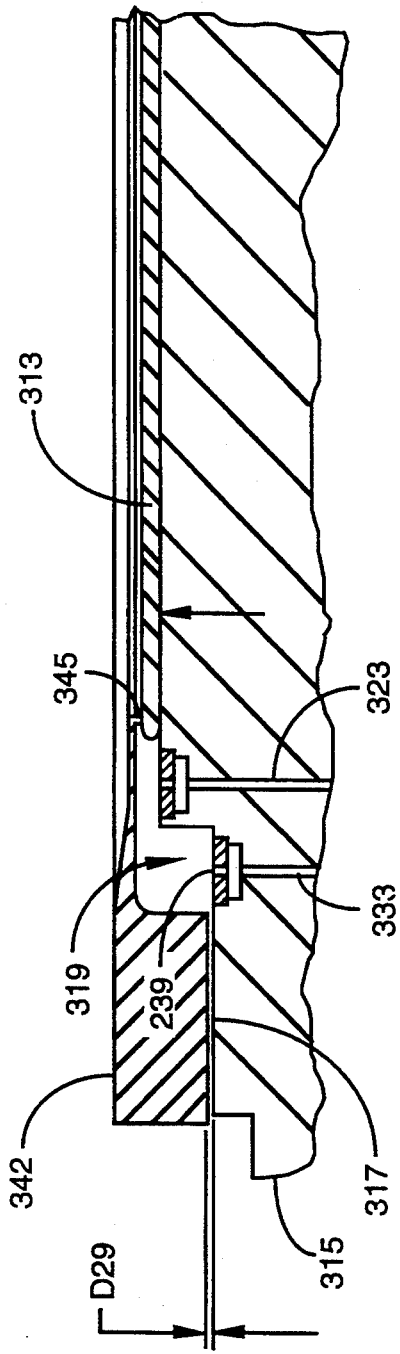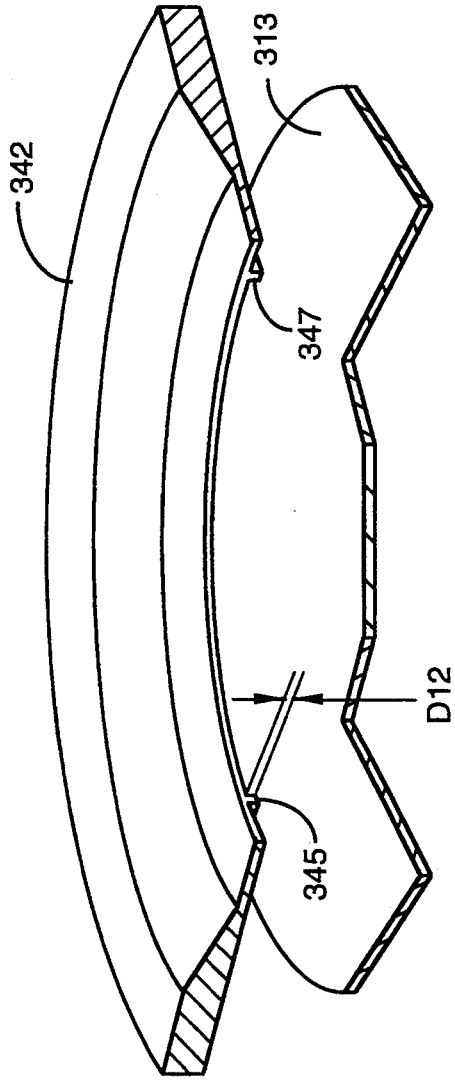

PURGE GAS IN WAFER COATING AREA SELECTION

This application is a continuation in part of Ser. No. 07/812,734, filed Dec. 23, 1991, abandoned, also titled "purge Gas In Wafer Coating Area Selection, which is a continuation in part of Ser. No. 07/596,512, filed Oct. 12, 1991, now U.S. Pat. No. 5,094,885, and a continuation in part of Ser. No. 07/512,809, filed Apr. 23, 1990, now abandoned.

FIELD OF THE INVENTION

The present invention is in the area of apparatus for accomplishing chemical vapor deposition (CVD) processes on wafers as a manufacturing step in producing integrated circuits, and relates in particular to improvements in apparatus and methods for excluding deposition on the backside and edges of wafers in process.

BACKGROUND OF THE INVENTION

Manufacturing of integrated circuits is generally a procedure of forming thin films and layers of various materials on wafers of base semiconductor material, and selectively removing areas of such films to provide structures and circuitry. Doped silicon is a typical base wafer material. CVD is a well known process for epositing such thin films and layers. For example, polysilicon may be deposited from silane gas, $SiH_4$. It is known, too, to deposit tungsten silicide from a mixture of gases including silane and a tungsten-bearing gas such as tungsten hexaflouride. Pure tungsten is also deposited on silicon wafers in the manufacture of integrated circuits, sometimes selectively and sometimes across the entire surface in a process known as "blanket" tungsten.

In a typical CVD process such as blanket tungsten wafers are placed on supports within a sealable chamber, the chamber is sealed and evacuated, the wafers are heated, typically by heating the wafer support, and a gas mixture is introduced into the chamber. For example, in the blanket tungsten process, tungsten hexaflouride and hydrogen are introduced as reactive gases, and typically argon is introduced as a non-reactive carrier gas. The tungsten hexaflouride is the source of deposited tungsten. Typically the gases are flowed continuously during process. The temperature of a substrate (wafer) to be coated is one of the variables that drives the chemical reaction to cause tungsten to be deposited on the substrate surface. It is important to control the temperature, the concentration of various gases in the mixture introduced, and such characteristics as the uniformity of flow of gas over the surface being coated, among other variables. An even thickness of a deposited layer is an important characteristic.

In most cases, active structures and circuitry are formed on one side of a wafer, and the other side is not so used. The side not so used is called the backside of the wafer. In lithography procedures for defining patterns on deposited layers to aid in the proper selective removal of such deposited layers to form structures and circuitry, the backside of a wafer is typically used as a registering surface. For this and other reasons it is important that the backside of a wafer be kept smooth and clean, and that material not, in general, be deposited on the backside.

Another important characteristic in layering techniques is that the deposited layers be adherent to the base wafer material or to the next underlying layer, so layered material doesn't flake or peel. The dimensions of structures and circuitry in integrated circuit technology are very small, so any unwanted flaking or peeling may easily cause particles that may spoil structures or circuitry. Moreover, flakes from non-adherent material can spoil structures and circuitry on other wafers, and also may damage sensitive equipment and require cleaning procedures beyond those that might otherwise be necessary.

Several techniques are employed to enhance adhesion of layers deposited by CVD. One is to deposit a thin layer of a material known as an adhesion layer or a glue layer. An adhesion layer in some cases is an entirely different material known to be adherent to the base material and to the material of a new layer to be applied. An adhesion layer is also sometimes applied in a separate process other than CVD. For example, titanium is in some cases deposited by sputtering as an adhesion layer before depositing tungsten or a tungsten rich material, such as tungsten silicide, by chemical vapor deposition. Cleaning procedures, such as ion bombardment, are also used to prepare wafer surfaces to receive layers deposited by chemical vapor deposition.

For logistic reasons it is generally desirable to do pretreatment steps, such as ion cleaning, and to deposit adhesion layers, while a wafer is mounted in the same chamber and upon the same apparatus that will be used to perform the chemical vapor deposition. Otherwise the wafers to be coated have to be handled more often and mounted to and dismounted from different processing apparatus, which is time consuming and expensive, and increases the chances of damage, error, and contamination. Since the wafers are typically mounted in the CVD chamber with the backside against a support, only the frontside is presented to process steps designed to enhance adhesion. If only the frontside is cleaned or otherwise treated, the probability of subsequent coating on the backside or edge becomes greater.

The surfaces of wafers to be coated commonly exhibit a varying topography due to devices formed on the wafers, circuitry previously etched, and layers previously coated. These variations in topography are manifested typically in grooves (vias) and holes of varying depth in the surface, and it is important to be able to deposit films of relatively uniform thickness into such surface depressions, or in many cases, to fill the depressions completely.

FIG. 1A shows a section of a wafer 11 through an idealized via with a coating 13 to illustrate how coverage in vias and holes is quantified in the art. The severity of a via or hole is called Aspect Ratio (AR), and is the depth $D_1$ divided by the width $D_2$.

$$AR = D_1/D_2$$

Step coverage in a surface depression is quantified as a fraction or percentage determined by the minimum thickness $D_3$ of the film formed in the depression divided by the nominal thickness $D_4$ outside the via or hole. Typically, if coating conditions such as temperature and pressure remain constant, the step coverage degrades for most coating processes as the Aspect Ratio increases. Such degradation is more severe for line-of-sight processes like plasma sputtering than for CVD processes.

The trend of technical developments in the art of manufacturing integrated circuits is to greater and greater aspect ratio. One reason is that desirable increased density of devices and circuits on a single chip results in individual features being closer and closer together. Another reason is that manufacturers have developed multi-layering techniques wherein circuitry is built up in layers to make efficient use of surface area, and deep vias must be etched so that electrically conductive layers can be deposited to connect devices in different layers.

As device dimensions have decreased to typical dimensions under one micron, the coating thickness requirements have not decreased proportionally. The result is a situation depicted by FIG. 1B. Narrower and deeper depressions in the topography of a wafer, without decreasing coating thickness, causes closing of the depression by the coating. The situation shown in FIG. 1B is but one of many possibilities, and illustrates a serious flaw that can result. The closing of the depression by the coating can leave a pocket 14 beneath the closed coating surface. The pocket is generally detrimental to function and reliability. Hole filling is quantified by the decimal or percentage: $2 \times D3/D2$. 1 (or 100%) represents complete hole filling.

FIG. 1C shows a situation similar to that of FIG. 1B, except the depression has been completely filled, leaving no trapped pocket below the surface. Complete hole filling as shown in FIG. 1C is the only acceptable condition for reliable process when hole filling is required at all.

Experience in coating devices with topography having smaller and smaller device geometry and larger and larger aspect ratios has shown that there is a relationship between the pressure of the process gases during CVD processing and the ability to coat evenly into vias and holes, and to do complete hole filling. In general, as pressure increases, step coverage and hole filling improve, pass through a maximum point, and then decrease again. The maximum point has a temperature dependence, and the inventors have seen the maximum vary from 10 to 80 Torr total pressure. FIG. 1D is a three-dimensional plot showing how hole filling is effected by pressure and temperature in the apparatus of the present invention. The trend is believed to be similar for CVD equipment in general.

In addition to generally better step coverage and hole filling at higher pressures, up to a point, higher pressure also typically provides a generally higher deposition rate, increasing throughput and decreasing operating costs per wafer coated. These expected advantages have made higher pressure operation very desirable in processes like blanket tungsten, but the tendency to backside coating caused by higher pressure operation has, up until the present invention, made the high pressure operations difficult and generally impractical. Blanket tungsten, for example, has typically been done at a total process pressure below 1 Torr.

Processes today are being done with total process pressures of 30 Torr and more, and processes are contemplated with total process pressures much higher; perhaps 80 to 100 Torr. An upper limit is not known at this time. What is needed is apparatus and method to allow these much higher process pressures while excluding coating gases from the edge and backside of wafers in process.

SUMMARY OF THE INVENTION

In a preferred embodiment of the invention an apparatus for preventing edge and backside coating on a wafer during processing in a CVD chamber comprises a support means within the CVD chamber for supporting the wafer during processing and a means for flowing purge gas past the edge of the wafer and into the CVD chamber, opposing flow of coating gases to the edge and backside of the wafer.

In an alternative embodiment the means for flowing purge gas comprises an enclosure for forming a purge volume around the edge of a wafer substantially separate from the CVD chamber and positionable relative to the wafer with only the frontside of the wafer substantially exposed to the interior of the chamber. The purge volume and the interior of the chamber are connected by a slot of substantially constant height. The means for flowing purge gas in this embodiment also comprises a gas supply means for flowing purge gas to the purge volume at a pressure in the purge volume greater than the pressure in the CVD chamber. Purge gas flows through the slot into the CVD chamber.

In another embodiment a wafer seal ring holds a wafer against a CVD chuck contacting the wafer continuously around the periphery of the wafer, forms an annulus around the wafer, and forms a proximity seal around the wafer with a surface of the CVD chuck. A carrier attached to the wafer seal ring supports and moves the ring. A purge gas is conducted to the annulus around the wafer, and by flowing out through the proximity seal excludes process gases from migrating into the annulus where coating on the edge and backside of a wafer may occur. The gas is conducted directly to the annulus, rather than behind the wafer, making the proximity seal the main impediment to flow, which limits pressure buildup behind the wafer that would distort the wafer, distorting temperature profile and resulting in thickness non-uniformity.

In a preferred embodiment the carrier for the wafer seal ring includes a guide, a cam track to actuate the carrier, and a spring for applying force to the wafer against the CVD chuck. Also in a preferred embodiment, the surface of the chuck and the surface of the wafer seal ring that form the proximity seal are both flat surfaces, and the gap between them has a depth X and a radial length Y, such that depth X, when combined with the volume rate of flow of purge gas, provides an impulse for the purge gas equal to or greater than the impulse in the opposite direction of coating gas in the seal area, and radial length Y is equal to or greater than ten times the mean free path of coating gas in the proximity seal.

Several alternative embodiments are described, providing a variety of wafer supports and a variety of means for holding the wafer and for flowing purge gas past the edge of the wafer to oppose diffusion of coating gas to the edge and backside of the wafer.

A significant advantage of the invention is that edge and backside coating can be eliminated even at very high processing pressures. An additional advantage is that the flow of inert gas through the proximity seal helps to transfer heat from the chuck to the wafer seal ring, so the ring is more nearly the temperature of the wafer, and does not act as a heat sink at the area of contact with the wafer.

BRIEF DESCRIPTION OF THE DRAWINGS

FIG. 10 is a table of uniformity measurements on wafers processed.

FIG. 17A is an elevation section showing another embodiment.

FIG. 17B is a partial plan view of a part of the apparatus shown in FIG. 17A.

FIG. 18A is an elevation section showing another embodiment.

FIG. 18B is a partial plan view of a portion of the apparatus shown in FIG. 18A.

FIG. 19A is an elevation section showing another embodiment.

FIG. 19B is an isometric view showing detail of the wafer seal ring in the embodiment shown in FIG. 19A relative to the wafer.

DESCRIPTION OF THE PREFERRED EMBODIMENT

Figure 1A:
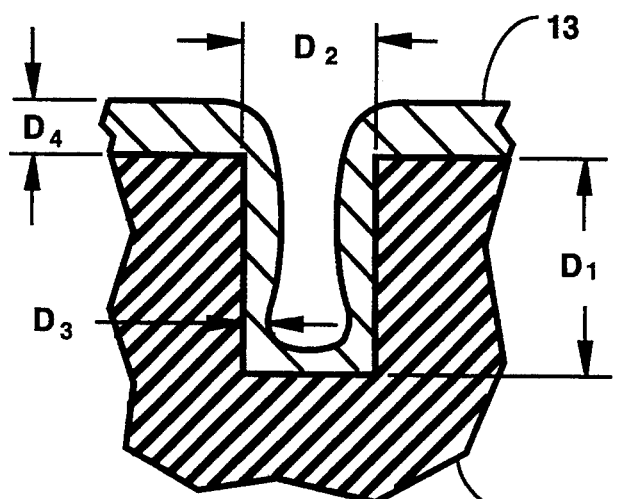
FIG. 1A is a section through a via in a coated wafer to illustrate the meaning of step coverage.
Figure 1B:
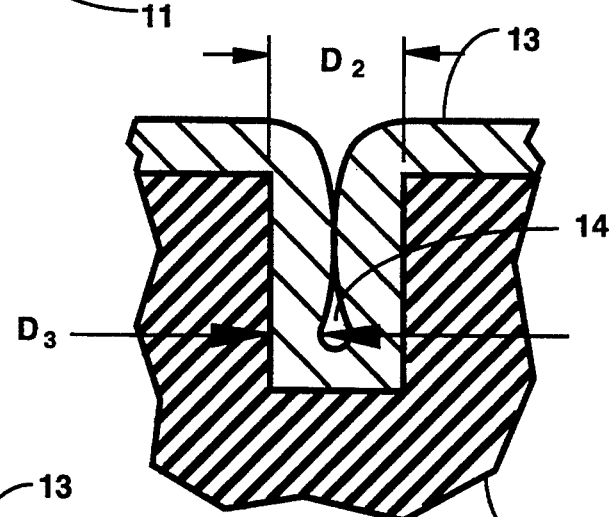
FIG. 1B is a section through a via in a coated wafer to show the closing of a via as aspect ratio becomes larger and coating thickness remains constant.
Figure 1C:
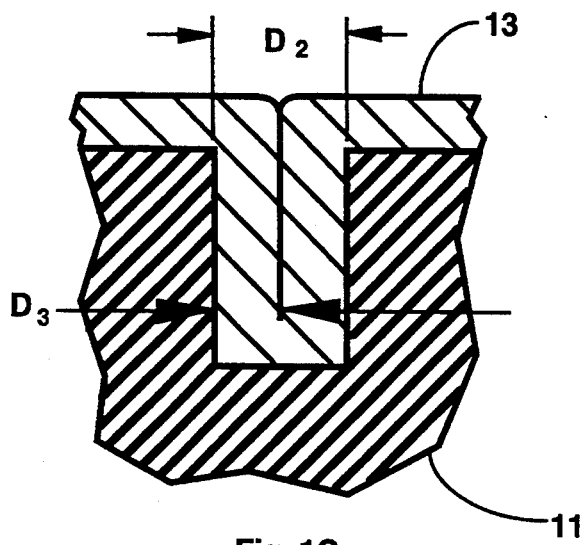
FIG. 1C is a section through a via in a coated wafer to illustrate the meaning of complete hole filling.
Figure 1D:
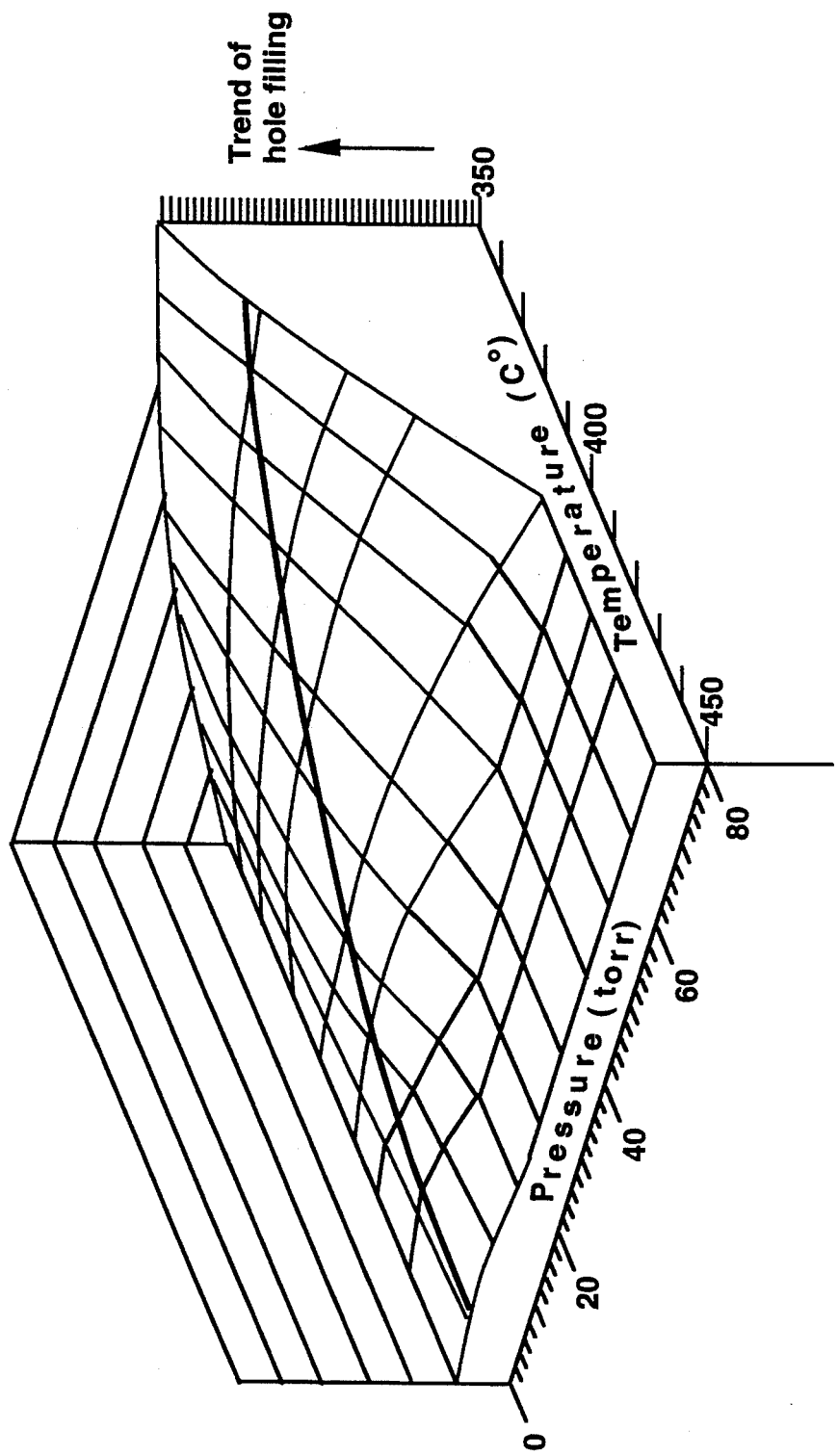
FIG. 1D is a three-dimensional plot of tendency to fill holes in a CVD process, related to temperature and pressure
Figure 2:
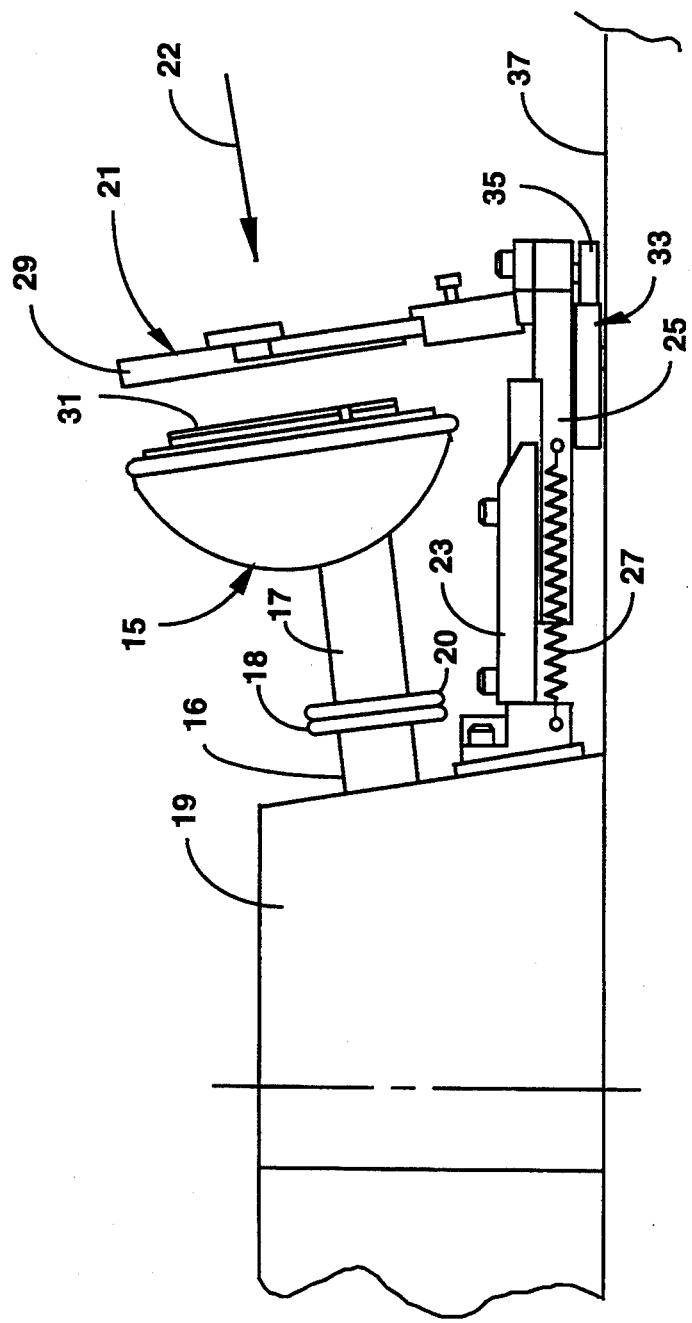
FIG. 2 is an elevation view of a CVD chuck and a wafer seal ring apparatus in a preferred embodiment.

FIG. 2 is a side view of a single station of a chuck assembly with a wafer seal ring according to the present invention, with passages and associated equipment to flow substantially non-reactive gas from outside the reaction chamber to inlets on the wafer side of the wafer seal ring. The gas passages and associated equipment are not shown in FIG. 2. In this specification the inert gas flowed to the wafer side of the wafer seal is referred to as purge gas, because the purpose is to purge process gas that could cause coating on the edge or backside of a wafer.

A CVD chuck assembly 15 for supporting and heating a wafer to be processed is mounted on a mounting arm 17 that extends from a central hub 19. An extension 16 from the central hub has a flange 18, and arm 17 has a mating flange 20 in the preferred embodiment for mounting chuck assembly 15 to the central hub. In the preferred mode there are six CVD chuck assemblies mounted at different angular positions from the central hub, and the hub is rotatable. There can be more or fewer than six chucks assemblies.

A seal ring apparatus 21 associated with the CVD chuck includes a mounting apparatus 23 extended from the central hub, a slide arm 25 urged toward the central hub by a spring 27 and a seal ring 29 that moves with the slide. A cam track apparatus 33 fastened to the floor 37 of the CVD chamber in the preferred embodiment engages a cam follower 35 attached to slide arm 25 to move seal ring 29 away from the CVD chuck at one position in the rotation of the central hub so wafers can be unloaded from and loaded to the chuck. The seal ring apparatus is shown away from the wafer in FIG. 2, as would be the case at the load/unload position. At rotary positions away from the load/unload position the cam follower is not engaged and spring 27 causes ring 29 to urge toward wafer 31.

The central hub, the CVD chucks, the seal rings, and associated apparatus are all enclosed in a sealable CVD chamber (not shown). There is a sealable opening at the load/unload position where a wafer may be passed out of or into the chamber from a load-lock or other volume outside the CVD chamber.

Figure 3:
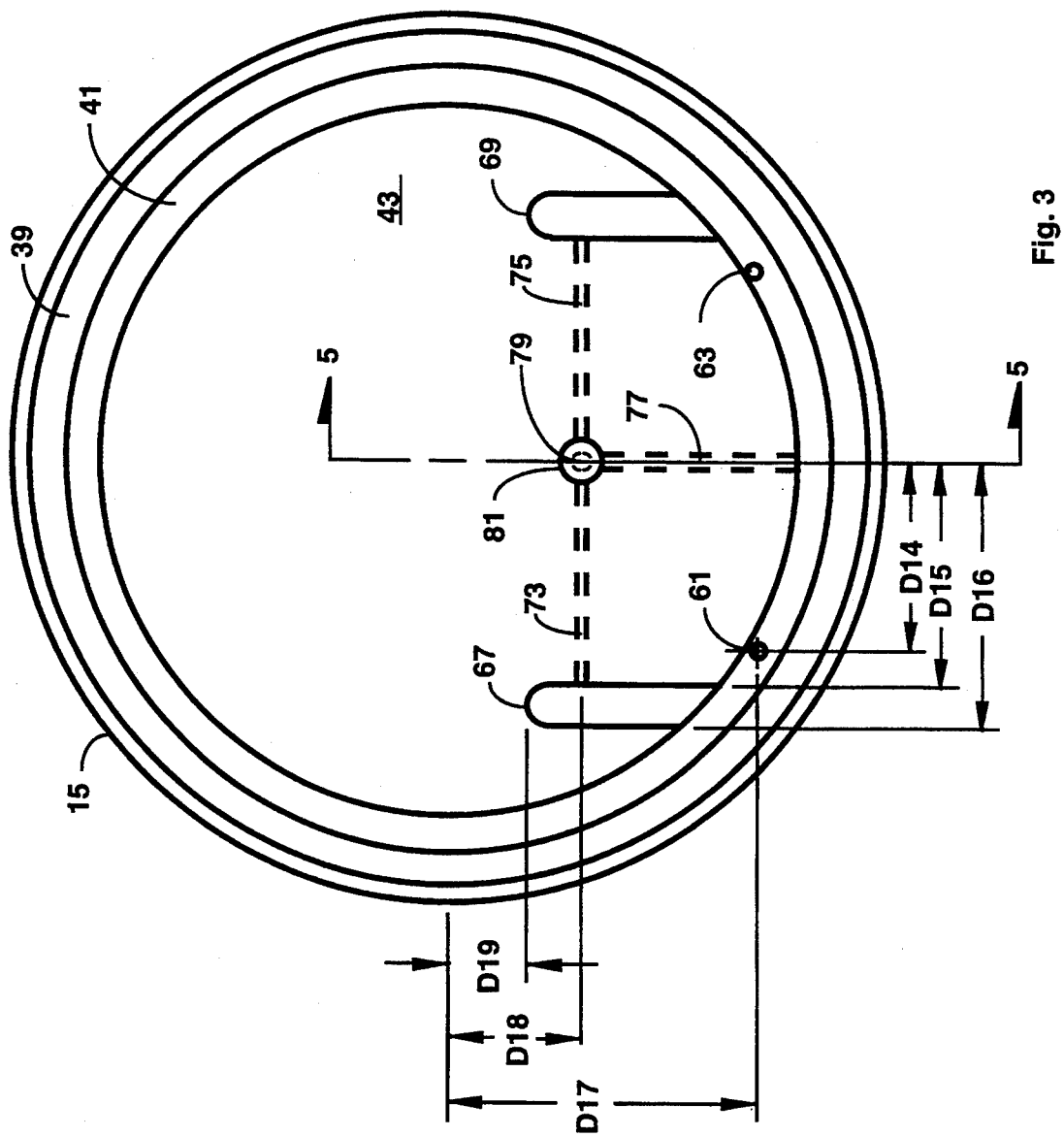
FIG. 3 is a face-on view of a CVD chuck in the apparatus of the embodiment shown in FIG. 2.
Figure 4:
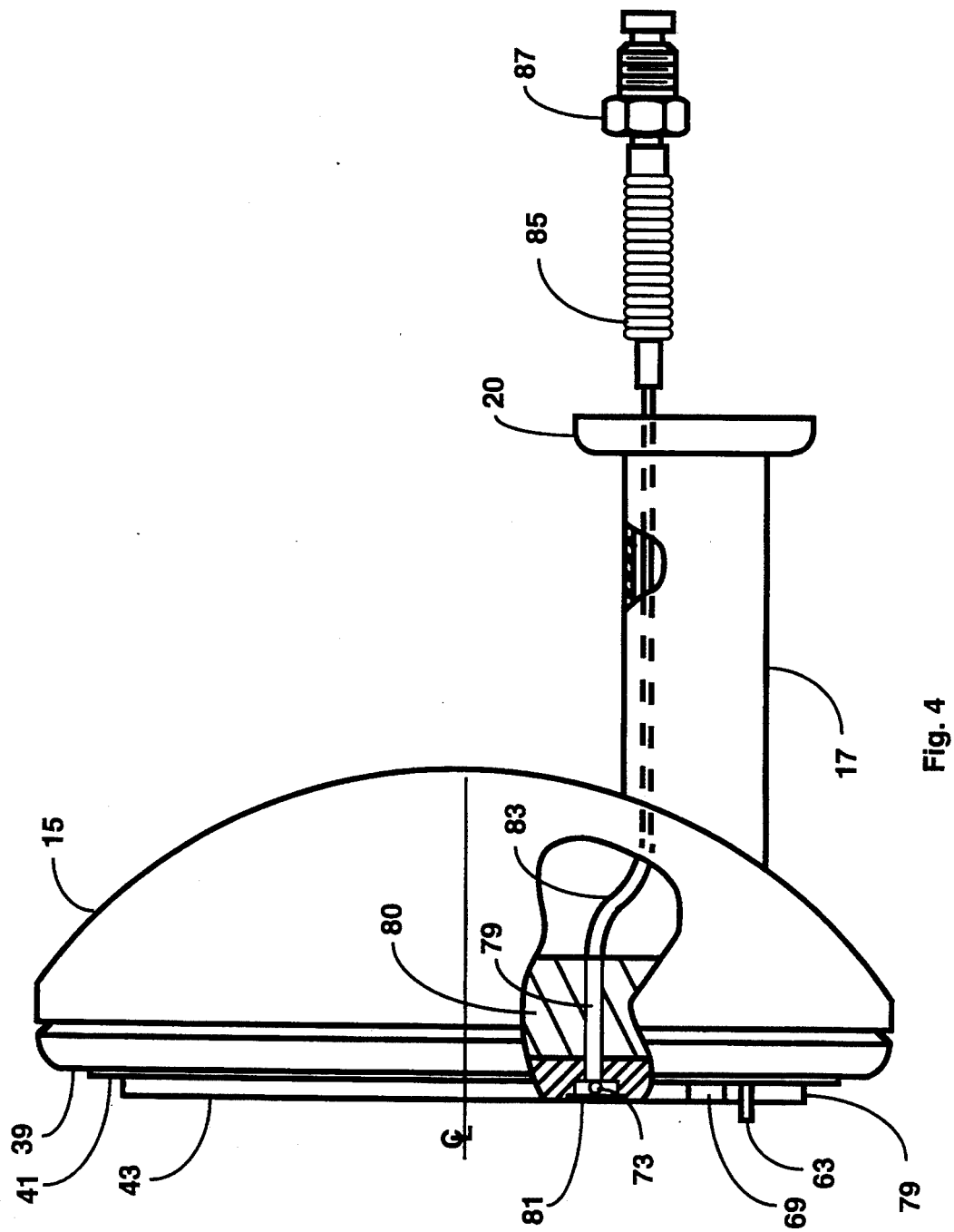
FIG. 4 is a side view of the CVD chuck of FIG. 3 with sectioning to show the arrangement of gas passages in the chuck.

FIG. 3 is a face-on view of the face of CVD chuck assembly 15 in the direction of arrow 22, without wafer 31 or wafer seal apparatus 21. FIG. 4 is a side view of the chuck assembly of FIG. 3, disconnected from the central turret at flange 20. A wafer, when loaded on the chuck assembly, rests on pins 61 and 63, which protrude from surface 41 of the chuck assembly and extend beyond surface 43, such that a loaded wafer rests against surface 43. In another embodiment the pins project from surface 43, and surface 43 is somewhat larger in diameter than the wafer to be processed. Slots 67 and 69 in surface 43 are clearance slots for appendages of a loading arm (not shown) that loads and unloads wafers to and from the chuck assembly in the preferred embodiment. The clearance slots extend in depth to surface 41, which is a machined surface forming one side of a proximity seal with seal ring 29. In a preferred embodiment for a 150 mm nominal diameter wafer D14 is about 51.3 mm, D15 is about 57.3 mm, D16 is about 66.7 mm, D17 is about 56.2 mm, D18 is about 24 mm, and D19 is about 16.8 mm.

A non-reactive purge gas, argon in the preferred embodiment, is conducted via lateral passages 73, 75 and 77, which are bored into the monel material of the chuck face. Two of the lateral passages terminate in slots 67 and 69, and the third through wall 79 between surfaces 43 and 41. The three lateral passages are each about 2.6 mm in diameter. Lateral passages 73, 75 and 77 lead from a central passage 79 that extends through the chuck base and a copper heating block 80, and is plugged at surface 43 by a welded plug 81.

Gas is conducted to passage 79 through stainless steel tubing 83 in the preferred embodiment, and the tubing is connected to a bellows 85 for alignment. The bellows is connected to a tube fitting 87 that connects in assembly to a mating fitting (not shown) from the central hub. Gas is fed to the several stations from a pressurized reservoir through a flow control device (not shown).

Figure 5:
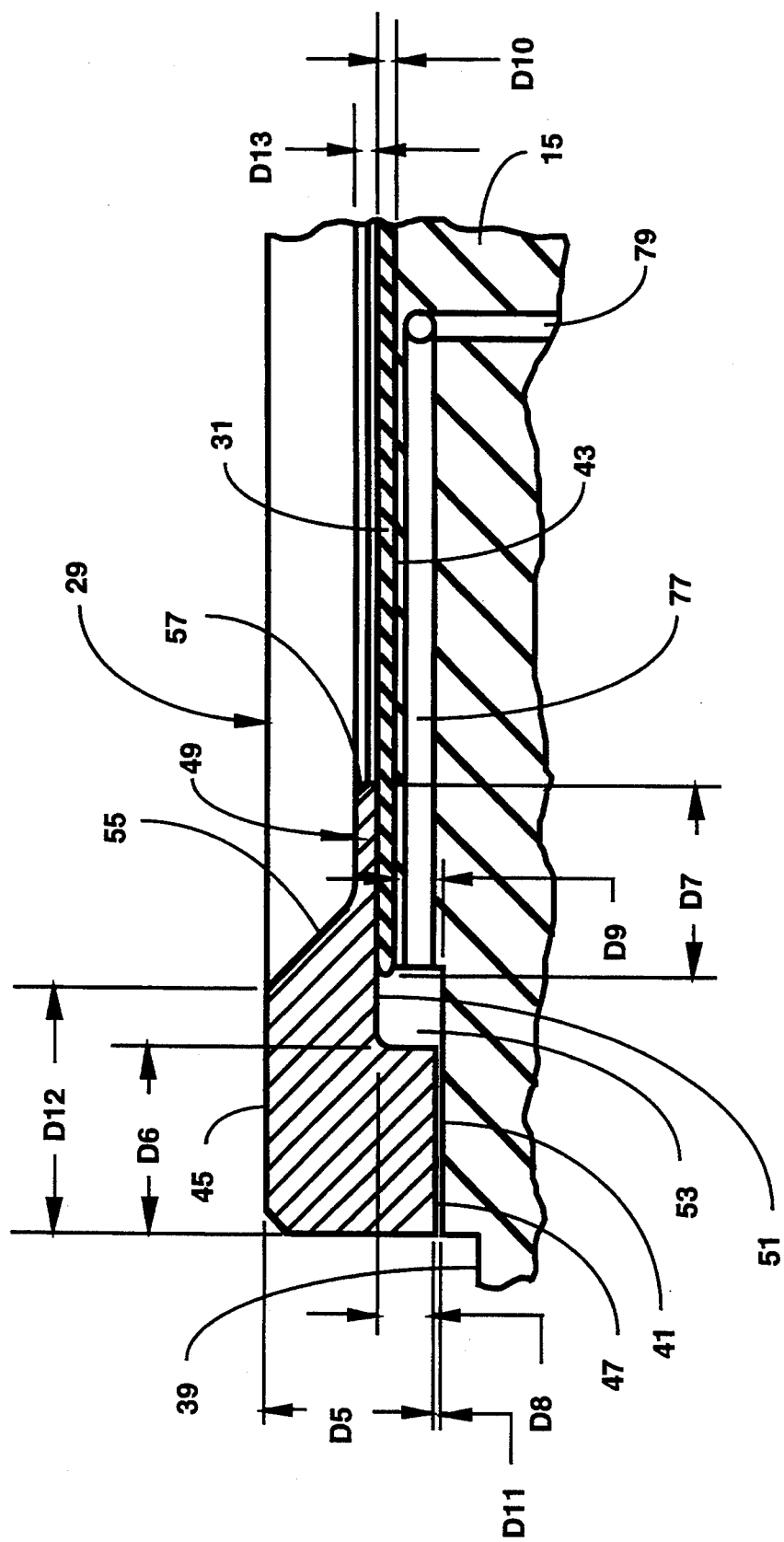
FIG. 5 is a section view showing the chuck, the wafer seal ring, and a wafer in a preferred arrangement, to show how inert gas is provided to the wafer to exclude coating gas at the edge and backside of the wafer.

FIG. 5 is a partial section view showing wafer 31 held against CVD chuck assembly 15 by seal ring 29. The section is taken along section line 5—5 of FIG. 3. In FIG. 5 the wafer seal apparatus is closed, and the seal ring is urged against a wafer on the chuck with a force of about 10 pounds in the preferred embodiment.

The front of CVD chuck 15 has three levels in the preferred embodiment: a base level 39, first raised surface 41, and face 43. The first raised surface is circular and has an outer diameter substantially the same as the outer diameter of wafer seal ring 29. Surface 43 in the preferred embodiment is substantially the size of the backside of a wafer to be processed, and differs in size for chucks made to accommodate different wafers. In other embodiments surface 43 is somewhat larger in diameter than the wafer. When a wafer is loaded to the CVD chuck, the wafer rests against surface 43. Although surface 43 in the preferred embodiment has about the same diameter as the wafer to be loaded, it has no complementary shape to wafer flats that are formed on the edge of wafers for orientation and identification purposes. In the preferred mode, surfaces 41 and 43 are carefully machined and polished to be flat within about 0.025 mm over the expanse of each surface.

Wafer seal ring 29 has an outer portion 45 with a thickness $D5$ in the preferred embodiment of about 12 mm. and a flat machined surface 47 orthogonal to the axis of the seal ring. Width $D6$ of surface 47 in the diametral direction is a minimum of about 10.5 mm. in the preferred embodiment. The outside diameter of ring 29 and of chuck assembly 15 in the preferred embodiment is about 25 cm., and the diameter of surface 43 is provided in the manufacture of chucks to accommodate specific standard wafer sizes from 200 mm and smaller. The common larger outer diameter allows many common parts to be used in systems assembled to coat wafers of different standard sizes.

The seal ring has an inner portion 49 with a flat machined surface 51 parallel to surface 47. Surface 51 is the surface that contacts the frontside of a wafer when the seal apparatus closes. Surface 51 extends toward the ring center to an extent that an overlap $D7$ of between 3 and 5 mm. is created, and the inner periphery is machined as a series of flats (not shown) so that a wafer with any standard flat of the nominal diameter for which a chuck and seal ring have been prepared, may be loaded and contacted by the seal ring continuously around the outer periphery of the wafer. It is important that contact with the wafer be continuous. The provision of flats and wafer orientation are not critical to the invention.

The spacing $D8$ between surfaces 47 and 51 is controlled in machining relative to distance $D9$ and the thickness $D10$ of wafer 29 to control gap dimension $D11$ between surface 41 of the CVD chuck and surface 47 of the wafer seal ring. For example, for a nominal 100 mm diameter wafer with the apparatus of the preferred embodiment, $D8$ is 4.37 mm (172 inches) plus or minus 0.0127 mm (0.0005 inches), wafer thickness $D10$ is known to vary from 602 mm (0.0237 inch) to 0.648 mm (0.0255 inch), and $D9$ is 3.81 mm (0.150 inches) plus or minus 0.0127 mm (0.0005 inches). The maximum gap $D11$ is the maximum wafer thickness 0.648 mm (0.0255 inches), plus the maximum $D9$ dimension of 0.3823 mm (0.1505 inches), less the minimum $D8$ dimension of 4.356 mm (0.1715 inches), or $D11=0.114$ mm (0.0045 inches). The minimum gap $D11$ is the minimum wafer thickness 0.602 mm (0.0237 inches), plus the minimum $D9$ dimension of 3.797 mm (0.1495 inches), less the maximum $D8$ dimension of 4.382 mm (0.1725 inches), or $D11=0.0178$ mm (0.0007 inches). In measurements of a system in use with tolerances equal to those described above for a 100 mm nominal wafer, the gap width $D11$ was found to vary from 0.031 mm (0.0012 inches) to 0.102 mm (0.004 inches); a very good correlation in practice to theoretical tolerances. The width $D6$ of surface 47 together with gap $D11$ between surface 47 and surface 51 forms a perimeter proximity seal around the wafer on the chuck, which, together with the continuous contact between surface 51 and the frontside of the wafer around the perimeter of the wafer, forms a barrier to the migration of coating gases in process to the edge or the backside of a wafer held in the apparatus.

The outer diameter of surface 51 of the seal ring has to be greater than the outer diameter of a wafer to be processed and also greater than the diameter of raised surface 43, and an annulus 53 is enclosed at the edge of the wafer inside the seal ring. The width of this annulus provides clearance for operation, and must also be greater than the diameter of pins 61 and 63 that support a wafer when the wafer seal apparatus is open. The width of annulus 53 in the preferred embodiment is about 6 mm. The width could be greater or smaller, as long as the annulus does not become a greater impedance to gas flow than the proximity seal.

Outer portion 45 of seal ring 29 is joined to inner portion 49 by an angled surface 55. In the preferred embodiment dimension $D12$ for a wafer of 200 mm diameter is about 15 mm. and the angle of surface 55 with the axis of the ring is about 45 degrees. It has been found that an angle is an advantage in many CVD processes to avoid interference with flow of gases to the frontside of the wafer, which might cause an uneven distribution of deposited material. The angle, however, can be as small as 20 degrees, and may begin almost at the inner periphery of the seal ring. The thickness $D13$ of the inner portion of the seal ring in the preferred embodiment is about 1.02 mm (0.040 inches), with a chamfer 57 of about 0.51 mm (0.020 inches) by 45 degrees. The relatively thin section and the chamfer both help to avoid disturbance in the flow of CVD gases to the frontside of the wafer during processing, especially near the area of contact with the frontside of the wafer. The more massive outer portion of the ring provides stability during temperature excursions that might otherwise warp or fracture the ring. The ring material, like the chuck material, is monel metal in the preferred embodiment.

Section view FIG. 5 additionally shows gas passage 77 leading from passage 79 into annulus 53. Inert gas is flowed into annulus 53 for relatively high pressure processes, generally above 1 Torr total pressure, as an aid in excluding coating gas flow or diffusion through the gap between surfaces 41 and 47, the proximity seal. In preparing to process wafers in a low pressure process, generally below 1 Torr total pressure, the volume of the CVD chamber is evacuated, establishing a vacuum. The vacuum level between deposition cycles is typically about 1 millitorr. To initiate deposition, CVD gases are conducted into the chamber. When gas is first conducted into the CVD chamber there is a pressure differential between volume 53 around the edge of a wafer clamped on a chuck by a wafer seal ring and the rest of the CVD chamber. This pressure differential will cause gas to flow through gap D11 of the perimeter proximity seal into annulus volume 53. The flow will decrease over time, because the pressure will rise in volume 53 decreasing the pressure difference toward equilibrium. To avoid introduction of gas to volume 53 that would cause deposition on the wafer edge, the first gas typically introduced before deposition begins is an inert gas, such as argon; a gas that will not cause deposition. The gas bearing the material to be deposited, such as tungsten hexaflouride for a deposition of tungsten or an alloy of tungsten, is introduced only after enough time has passed for pressure equilibrium to be established between the chamber and the small volume 53 around the edge of wafers on the chucks.

Because pressure equilibrium is established between the small volume around a wafer inside the seal ring and the rest of the CVD chamber by the introduction of an inert gas, the only mechanism by which material might enter volume 53 and cause deposition on the edge or the backside of a wafer is by diffusion. The material in CVD processing is introduced as a gas, such as tungsten hexaflouride for tungsten. The CVD chuck and the ring are at a high temperature, such as 400 to 600 degrees Centigrade. The CVD gas bearing the material to be coated will tend to migrate in the D11 gap of the perimeter proximity seal due to molecular diffusion action at the high temperature, but will also tend to coat on chuck surface 41 and ring surface 47 in the gap. If gap dimension D11 is relatively small, and gap width D6 is relatively large, there will be a high probability of collisions of gas molecules with surfaces 41 and 47 and a high probability of depletion of the coating material in the gap before reaching volume 53, where coating might be precipitated on the edge or the backside of a wafer.

It has been found in trial depositions that with a dimension D6 of 10.67 mm. (0.420 inches) for the perimeter proximity seal, and with total process pressures up to about 1 Torr, that gap D11 can vary from 0 to about 0.279 mm. (0.011 inches), before any signs of edge coating appear. This is a ratio of width to length of about 38:1. Generally it has been found that to be effective for processes with a total pressure of about 1 Torr and below, and without purge gas flow, the perimeter proximity seal should have a width to gap ratio of more than 35:1, preferably more than 38:1, and most preferred, a ratio of about 80:1 or higher.

In practice, a gap of 0 is not attainable, because of the realities of machining tolerances, and the fact that interference (touching) of surfaces 41 and 47 means that pressure is relieved on the face of the wafer, and surface 51 will not everywhere contact the wafer. Dimensions are controlled so the D11 gap of the perimeter proximity seal is not less than about 0.025 mm (0.001 inch). It is preferable to operate with a larger gap respecting the 35:1 ratio of width to gap dimension, because as material deposits in the gap, the gap becomes smaller, until it is necessary to pause for a cleaning operation to restore the original dimensions and tolerances.

For process requiring a total pressure of process gases below 1 Torr the seal ring with a proximity seal as described above is adequate to prevent edge and backside coating on wafers. For processes requiring total pressure of the process gases above about 1 Torr, the proximity seal alone is not always adequate to prevent edge and backside coating on a wafer. For the processes with a total pressure above 1 Torr an inert gas is flowed to annulus 53 via passages 73, 75 and 77.

When no purge gas is used, the gap to width ratio is quite important. When gas is flowed from behind the seal ring to exclude coating gases the situation is somewhat different. In this case it is important that the impulse (mass times velocity) of the purge gas radially outward in gap D11 be equal to or greater than the impulse of coating gas diffusing in the opposite direction.

The coating gas is typically not the only gas in the mixture admitted to a CVD chamber for coating. There is also a carrier gas, such as argon or hydrogen. The diffusion speed of the coating gas will vary depending on a number of variables, such as the total gas pressure, the kind of carrier gas used, and the temperature. Regardless of the carrier gas, however, to diffuse against a flow of purge gas, the coating gas must diffuse in the purge gas.

A diffusion constant is a statement of the expected rate of diffusion in all directions from a source point of one gas in another gas, and are typically expressed as square centimeters per second. Diffusion constants under various conditions are known in the art and published, and there are formulas known in the art for calculating diffusion constants. Diffusion constants can also be measured by various techniques, such as introducing gas at one place in a system and measuring change in concentration at another, such as by gas chromatography or mass spectrometer. There are also formulas known in the art for calculating the diffusion speed once a good value for the diffusion constant is known. One such formula is:

$$D = \text{square root}(2Dt)/t$$

where D is the diffusion constant and t is time.

The diffusion constant for tungsten hexaflouride at 400 degrees centigrade in argon at a total gas pressure of 1 Torr is about 50 square cm per second. Rate of diffusion is inversely proportional to total pressure, so for a 30 Torr pressure at 400 degrees centigrade the tungsten hexaflouride constant for argon is about 1.67 square cm per second. The diffusion speed for tungsten hexaflouride in argon is then about 1.8 cm per second.

The speed for purge gas can be calculated from the formula:

$$Q = (n)(v)(A)$$

where Q is flow, n is concentration and A is the cross section of the flow path. For example, if the flow of purge gas for one seal ring is 50 sccm, the radius of the seal ring is about 100 mm, and the gap D11 is about 0.1 mm (0.004 inches), the purge gas velocity calculates to be about 34 cm per second.

The mass number for tungsten hexaflouride is 300, and for argon purge gas is 40, so, given the previously calculated velocities, the impulse for tungsten hexaflouride in this example is 540, and for the purge gas 1360. The impulse for the purge gas is about 2.5 times the impulse for tungsten hexaflouride, providing a reasonable expectation of excluding coating gas from behind the seal ring.

The width of the gap should be about ten times the mean free path or more of tungsten hexaflouride at the given temperature and pressure. Methods for calculating mean free path under various conditions are known in the art, and tungsten hexaflouride the mean free path at 30 Torr and 400 degrees centigrade is about 4 micrometers. Ten times four micrometers is 40 micrometers, or 0.04 mm (0.001 inch). In the preferred embodiment the gap length is about 2 cm, enough to be more than ten times the mean free path for the entire range of total pressure from 1 Torr to atmospheric pressure.

In earlier efforts to prevent backside deposition by introducing an inert gas, gas was introduced through passages terminating directly behind the wafer. Many experiments have been conducted with inert gas flow, both with and without seal rings, and with gas introduced behind a wafer in various ways, but results were only marginally successful. For example, gas fed during process directly behind a wafer has been partially successful in preventing coating on the backside of a wafer, but does not prevent edge deposition. A wafer, in this arrangement, is also difficult to support on a chuck, as the gas flow tends to move the wafer away from the chuck surface. Moreover, the wafer movement causes serious problems in temperature uniformity, and hence in thickness uniformity, as temperature effects deposition rate.

Holding a wafer against a chuck at plural points around the wafer perimeter has also been tried with inert gas flow behind a wafer, but the uneven aspect of the force against the wafer again contributes to unevenness in temperature and resultant lack of uniformity in thickness.

Figure 6:
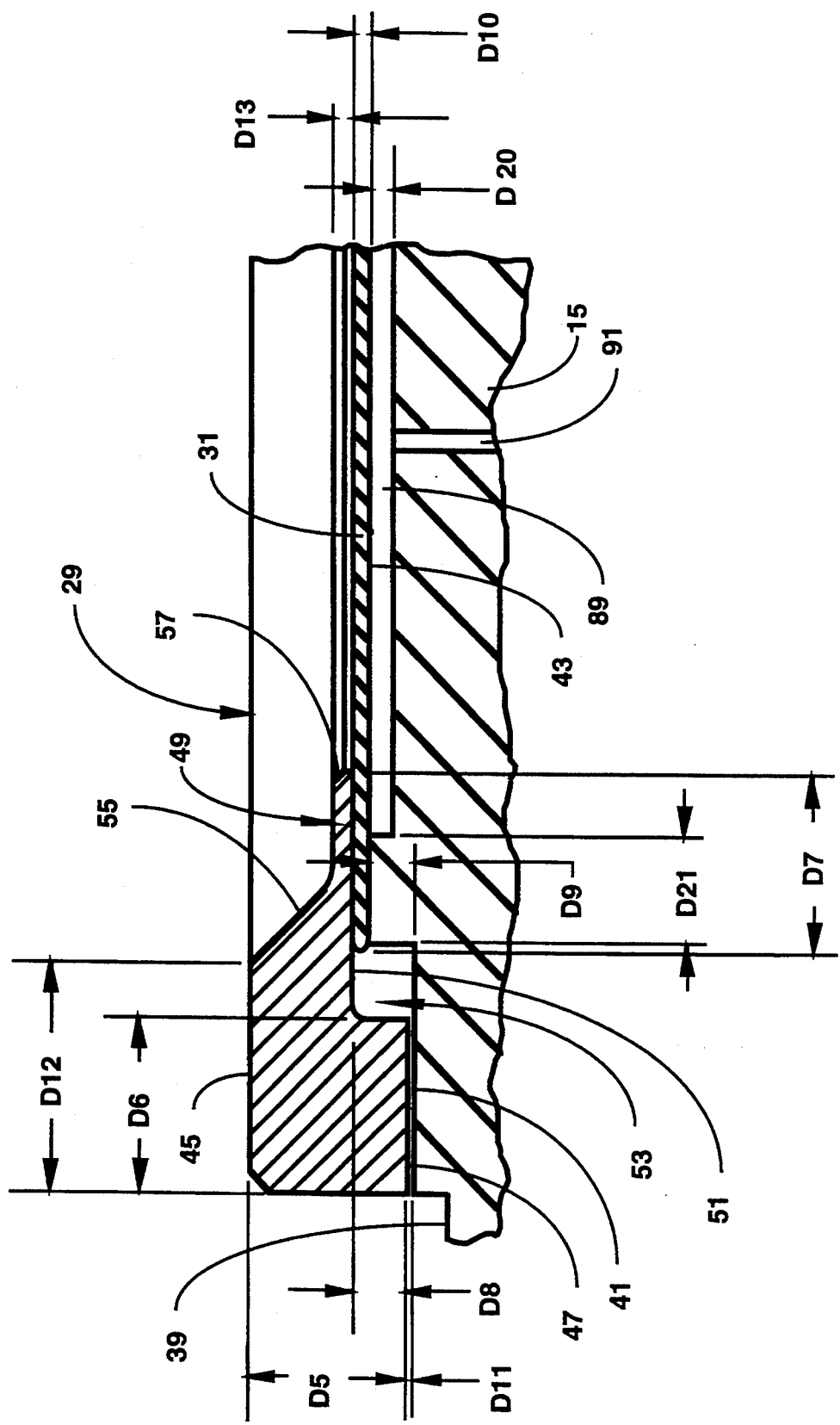
FIG. 6 is a section similar to the section of FIG. 5, but showing an early experiment that was not successful.

To better illustrate the sensitivity of a wafer to flow of gas to the backside of the wafer, results of earlier experiments are included here. FIG. 6 shows the cross section of FIG. 5, except in FIG. 6 a cavity 89 is machined behind the wafer and gas is conducted to the cavity through a passage 91. The depth D20 of cavity 89 is about 1.5 mm. The seal ring with proximity seal is as described above, and diametral distance D21 is about 7 mm, although the results have been shown to be relatively insensitive to D21.

Figure 7:
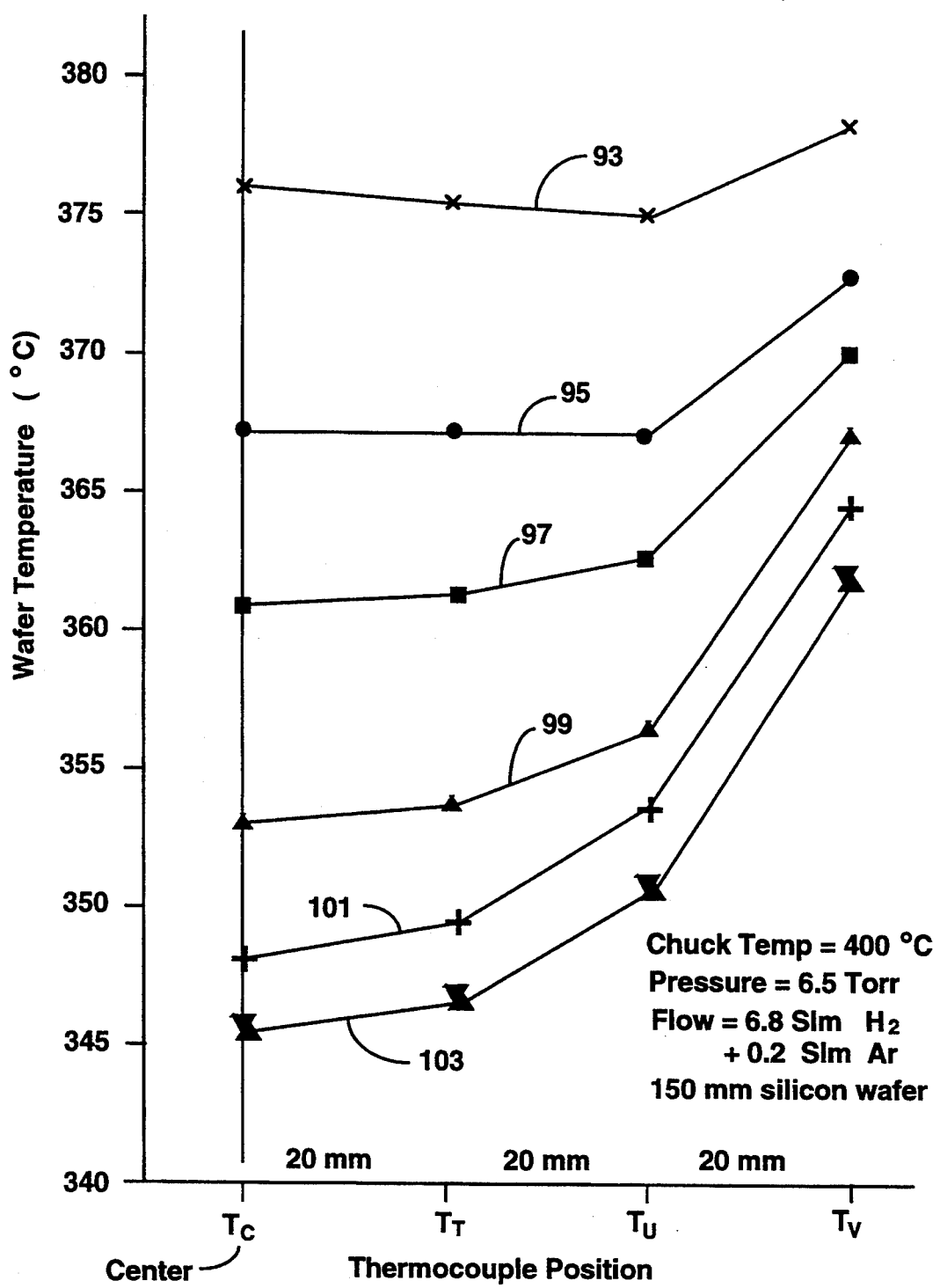
FIG. 7 is a plot of temperature profiles on wafers under varying flow conditions at a process pressure of 6.5 Torr, for the experiment illustrated by FIG. 6.

FIG. 7 is a plot of wafer temperature measured by thermocouples at the center of a wafer and at intervals of 20 mm radially for a blanket tungsten process at a total pressure of 6.5 Torr using the apparatus according to FIG. 6. The argon flow to prevent edge and backside coating was determined empirically to be 300 sccm with this design. Plot 93 is without gas flow. The total deviation in temperature is over a range of about three degrees C. Other experimental measurements have shown that each degree in temperature deviation results in a thickness deviation of about 1%. This thickness deviation is acceptable, but the absence of gas flow promotes undesirable edge and backside coating.

Plot 95 is for 25 sccm argon, plot 97 for 50 sccm, plot 99 for 100 sccm, plot 101 for 150 sccm, and plot 103 for 200 sccm. The temperature deviation, and hence the thickness deviation is seen to get steadily worse as flow is increased, such that at plot 103, with 200 sccm argon flow, the thickness deviation may be expected to be 15%, an amount that is completely unacceptable. Yet the required 300 sccm of argon to prevent edge and backside coating has not been reached.

Visual inspection during processing shows that the wafer, although held firmly at the perimeter, bows outward to the center. It is believed that the bowing produces non-uniformity in heat transfer resulting in the non-uniformity in temperature profile and thickness profile.

Figure 8:
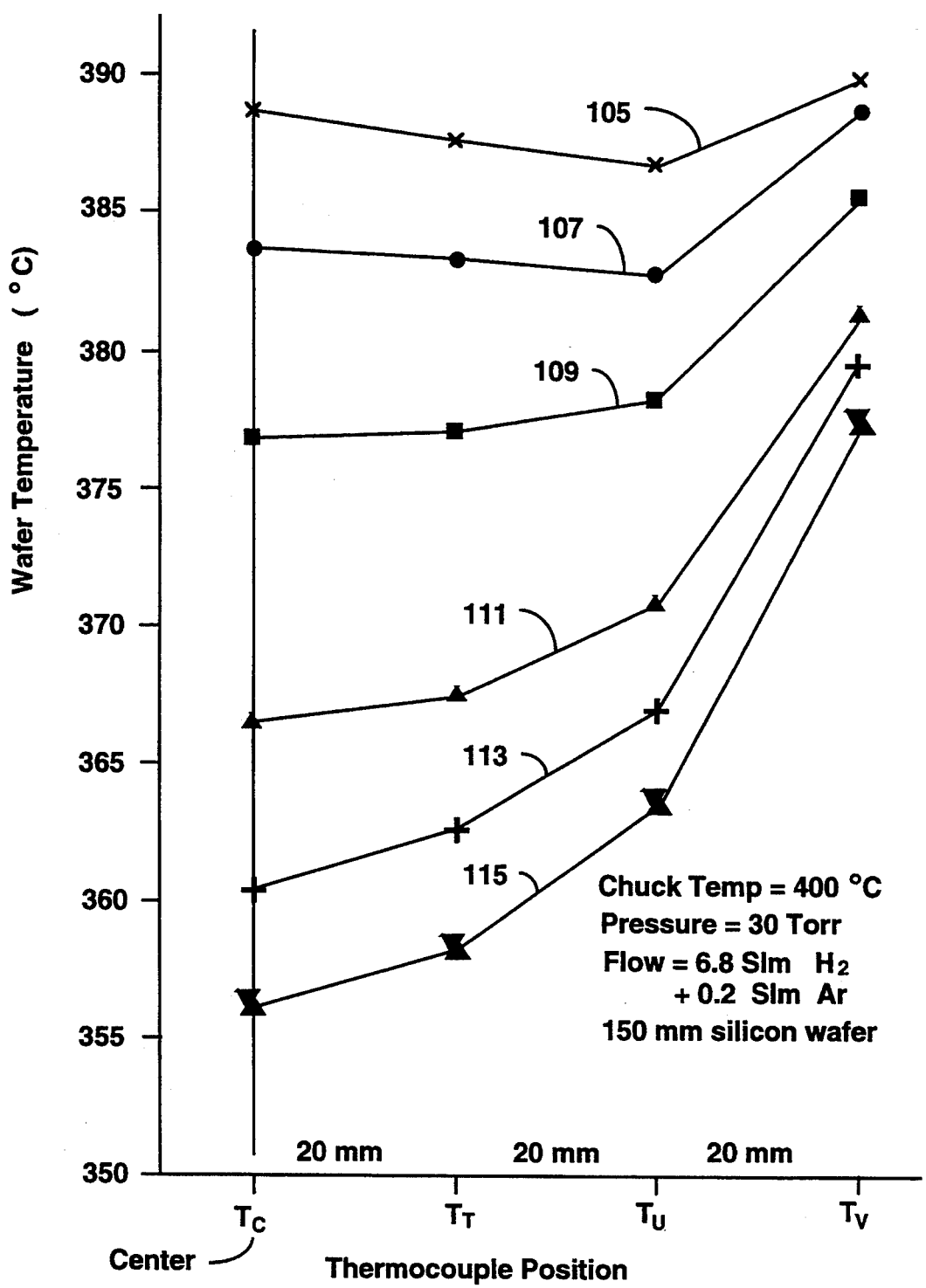
FIG. 8 is a plot of temperature profiles on wafers under varying flow conditions at a process pressure of 30 Torr, for the experiment illustrated by FIG. 6.

FIG. 8 shows the same situation as FIG. 7, except the total process pressure is 30 Torr. Plot 105, 107, 109, 111, 113 and 115 are for argon flow of 0, 25, 50, 100, 150 and 200 sccm, as before. Again, the deviation is nominal with no flow and deteriorates as flow increases, until, at 200 sccm, the deviation is more than 20 degrees C.

When gas is introduced behind a wafer and the wafer is held to the chuck around the perimeter, with or without a cavity such as cavity 89 in FIG. 6, the proximity seal is not the limiting impediment to gas flow. The contact of the wafer to the chuck is the limiting influence, and a greater pressure of gas is needed to force a flow than is needed to force the same flow through only the proximity seal, hence the bowing of the wafer.

With peripheral introduction of purge gas into annulus 51, as shown in FIG. 5, the proximity seal is the limiting impedance for gas flow. Still, at 300 sccm, the pressure in annulus 51 has been determined to be about 40 Torr for a total process pressure of 30 Torr, a difference of about 10 Torr. It is known that at a microscopic level the actual contact of the wafer with the chuck surface, even with the surface held to a flatness of 0.025 mm across the surface, is a contact of a large number of points, and gas may flow between the wafer surface and the chuck surface. Gas at 40 Torr from annulus 51 flows behind the wafer and establishes an equilibrium at about 40 Torr, the same pressure as in annulus 51. This is a much lower pressure than that behind the wafer with gas introduced as in FIG. 6, and does not cause bowing. Consequently, heat transfer is by conduction through the gas behind the wafer and is very uniform. Uniformity is enhanced at the higher pressures because intermolecular distance (mean free path) is smaller at higher pressure, and conduction becomes the primary mechanism for heat transfer from the chuck surface to the wafer.

Figure 9:
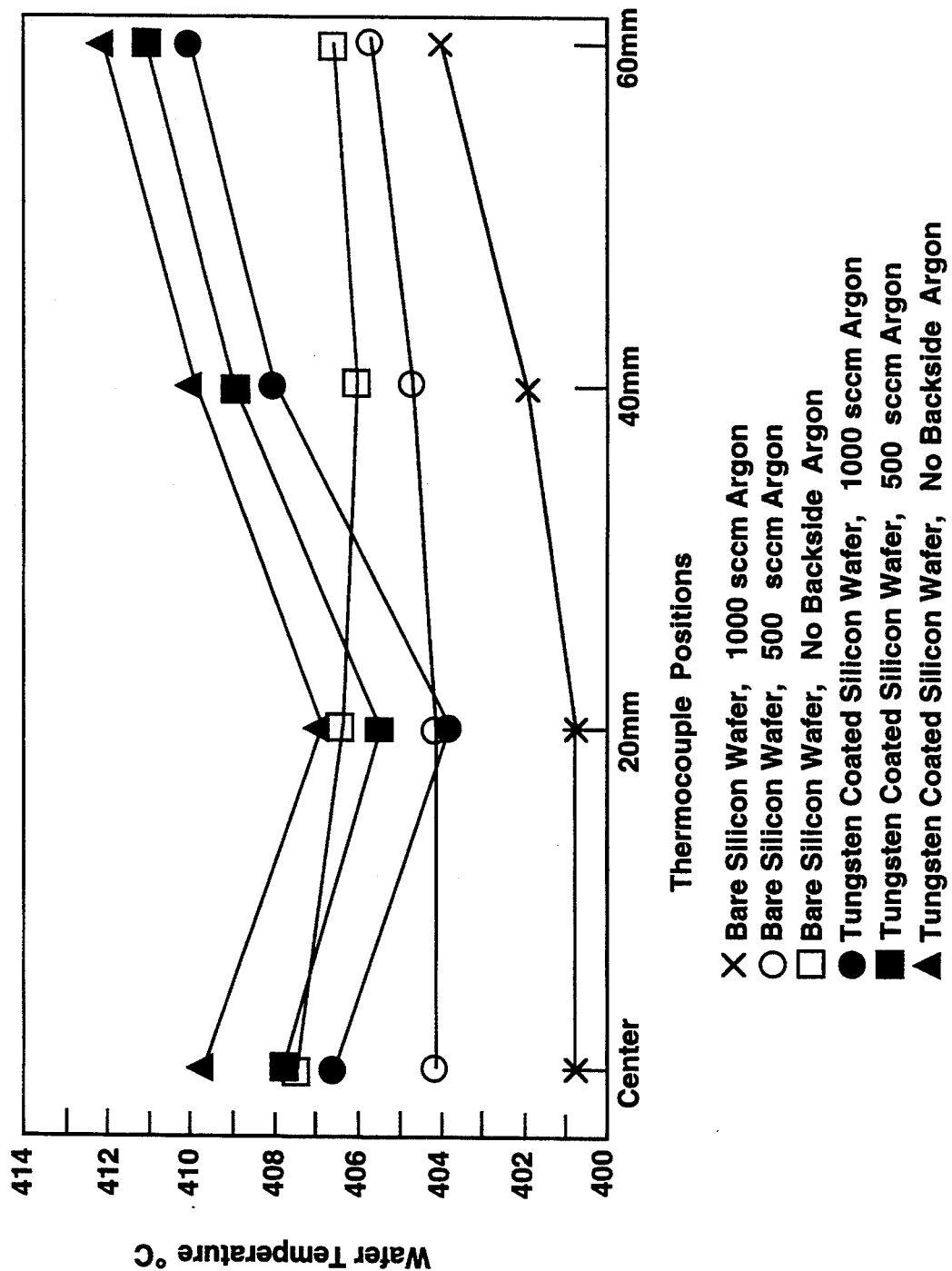
FIG. 9 is a plot of temperature profiles for wafers under various flow conditions in the apparatus of a preferred embodiment.

FIG. 9 is a temperature profile of several experiments performed with the apparatus of the preferred embodiment as described above. Argon gas flow to annulus 51 was changed from 1000 sccm to 500 sccm and to 0 sccm for a bare silicon wafer, and in the same increments for a tungsten coated silicon wafer. For the bare wafer, the temperature deviation was about 3 degrees, and was essentially the same for all three gas flows. For the tungsten coated wafer, the temperature deviation was about 5 degrees, and again did not change for the three flow levels. This result shows that temperature deviation is essentially independent of gas flow to the seal annulus in the preferred embodiment, although there is some dependence on coating material, likely due to a difference in emissivity.

FIG. 10 is a table of uniformity measurements made of wafers deposited in a Ti/Tungsten process at a total process pressure of 30 Torr with the apparatus of the preferred embodiment and a gas flow of 300 sccm to the seal annulus. The uniformity on any wafer is seen to be within 2.9% (1 sigma), wafer-to-wafer within 6%, and run-to-run within 0.5%.

There is an added benefit from the gas flow with the proximity seal relative to coating uniformity. Typically the seal ring is heated by proximity to the CVD chuck, and the small dimension of the proximity seal facilitates that heating effect. Ideally, the ring should be at the same temperature as the CVD chuck and the wafer. Due to the relatively large surface area of the ring, however, and the fact that it does not contact the chuck directly, the ring can act as a heat sink where it contacts the wafer, and draw heat from the wafer, creating a circular area of low temperature on the wafer near the ring. This temperature variation can cause deposition rate variation and effect the uniformity and quality of coating across the wafer. The typical way of dealing with this effect is to allow a sufficient time for temperature equilibrium be established. It has been recorded in practice that the flow of inert gas, resulting in a locally high gas pressure in the proximity seal area, provides a more efficient transfer of heat from the CVD chuck to the seal ring than without the gas flow, improving the uniformity variation due to the heat sink effect.

One with skill in the art will be aware that there are many variations that may be made in the embodiments described above without departing from the spirit and scope of the invention. For example, there are a number of different kinds of gases that could be used as the purge gas. Argon is used in the preferred embodiment, but Nitrogen, hydrogen and some other inert gases might be suitable. Similarly, there are many ways that a CVD chamber might be constructed and still be equipped to hold a wafer with a seal ring, a proximity seal, and purge gas flow as in the invention. The gas must be conducted to the annulus area around the wafer, but the number and position of passages entering may vary widely. The invention is also not limited to a particular wafer size. Equipment according to the invention can be built to process wafers of any size that are practical for integrated circuit manufacture.

The proximity seal used with processes for which the total process pressure is below 1 Torr and without purge gas requires a width to length ratio of 35 to 1 or greater, but with a purge gas, the gap can be wider and the width narrower, and still be operable, as long as sufficient purge gas is flowed so the impulse for the purge gas is larger than the impulse for the coating gas to be excluded.

Figure 11:
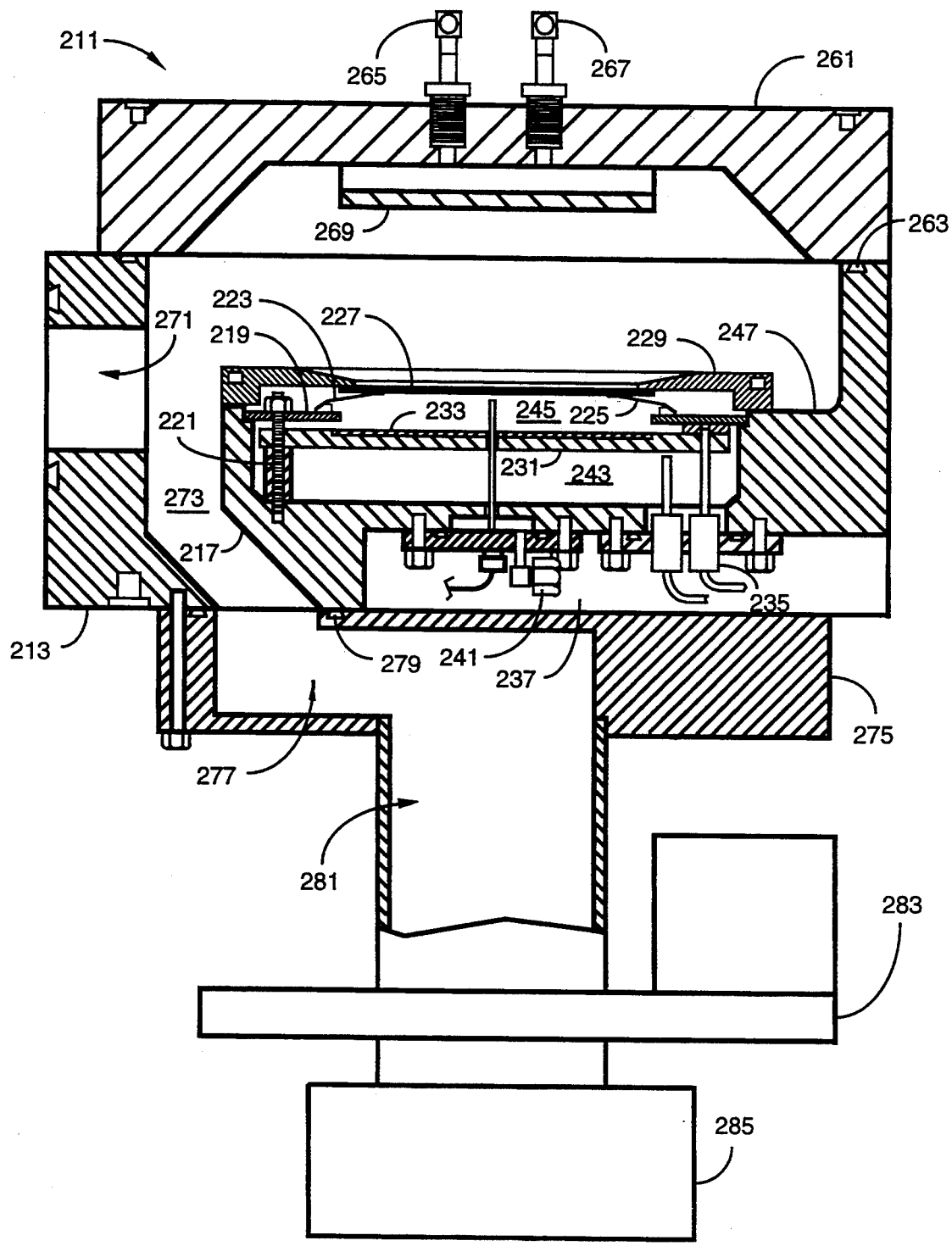
FIG. 11 is an elevation section view showing an alternative embodiment of the present invention.

FIG. 11 is a cut-away elevation view of a single-station CVD coating apparatus 211 according to a alternative embodiment of the invention. In this embodiment the main body of the CVD chamber is a specially machined block of aluminum 213 with an entrance opening for loading wafers, multiple ports for analytical gauges, and passages for vacuum pumping of the process gases.

Machining of body 213 provides a central pedestal 217 with a mounting shoulder and register for a support ring 219 held in position by threaded studs 221 in a circular pattern. Support ring 219 carries flexible wafer supports such as 223 and 225 arranged in a circular pattern to support a wafer 227 during processing. In this embodiment the wafer supports are leaf spring elements with a small contact area to touch the wafer.

A movable clamp ring 229 may be raised to allow a wafer to be placed on the supports. The clamp ring is then moved toward a loaded wafer, contacting the wafer with contact pads and providing a controlled width slot everywhere else around the periphery of the wafer. Three points of contact by three pads is preferred since three points define a plane and a minimum number of contact points is preferred, but more than three points could also be used. The support ring can be cooled in use by a coolant at a suitable temperature conducted in a channel in the ring.

A heater plate 231, supported substantially concentric with support ring 219 and wafer 227 incorporates a pyrolytic graphite heater 233 that is powered through a sealed electrical feedthrough 235. Clearance for mounting feedthroughs and connections is provided by a cavity 237 in casting 213. Cavity 237 is open at radial passage for connections to exit.

An inert gas such as argon is delivered through an inlet fitting 241 into a cavity 243 behind heater plate 231, where it flows around the heater plate to cavity 2.45 behind the wafer. The purpose of this gas flow is to prevent coating gases from diffusing behind the wafer, where they could cause coating of material on the backside and edge of the wafer. The gas is called purge gas because it purges the coating gases from the backside of the wafer.

With clamp ring 229 against wafer 227 depressing the flexible wafer supports, the clamp ring contacts body 213 in a complete circle on surface 247. There is then no path for purge gas to escape from behind the wafer into the process chamber except through the narrow passage between the clamp ring and the wafer around the wafer periphery.

In the embodiment of FIG. 11 several kinds of instruments are mounted within cavity 237 for taking measurements for experimentation and control.

A lid casting 261 is mounted to the open end of body 213 and sealed in the preferred embodiment by an o-ring seal 263. The mounting fasteners are conventional fasteners and are not shown. Gas feedthroughs 265 and 267 are for conducting coating gases into the process chamber volume during process and a baffle 269 helps to distribute the coating gases evenly as they flow into the coating chamber volume.

Opening 271 into the coating chamber is for entrance of a robotic transfer, not shown, that carries a wafer to be coated from outside the coating chamber into the chamber and places the wafer on the flexible wafer supports while the clamp ring is retracted. The same pick-and-place device retrieves a coated wafer from the supports and carries it through the opening out of the coating chamber when processing is complete. In an alternative embodiment a separate vacuum lock chamber is attached to the coating chamber at opening 271 with a valve to close the opening during process and separate valving and pumping apparatus not shown so the lock chamber can be cycled to vacuum and atmospheric pressure separately from the coating chamber. This allows wafers to be loaded and unloaded in the vacuum lock and the vacuum lock to be cycled to vacuum pressure while a wafer is being processed in the coating chamber. Such load/unload lock chambers are known in the art.

Passage 273 is a pumping passage in the embodiment illustrated. Manifold weldment 275 has a matching passage 277, and o-ring 279 forms a seal where the passages join. Typically, more than one pumping passage is used. The pumping passages lead to a central passage 281 in the manifold. Vacuum valve 283 leads to a turbomolecular vacuum pump 285. There are other vacuum valves and roughing pumps, not shown, such as are typical in single-station systems in the art.

In the embodiment shown clamp ring 229 is pivoted as a hinge near one side of the coating chamber volume, not seen in FIG. 11, and moved by means of a ferrofluidic sealed mechanical motion device. This is but one of many ways that the clamp ring may be moved, and many other ways are known in the art.

In operation, assuming no wafer in the process chamber and the process chamber under vacuum, a typical coating operation proceeds as follows: clamp ring 229 is moved away from pedestal 217 providing room for the robotic handler to place a wafer. Next, a wafer is placed on the flexible wafer supports and retracts, and the clamp ring moves until it contacts the pedestal. The contact of the clamp ring to the wafer leaves a controlled width slot on the frontside around the periphery of the wafer, as described above.

Next, purge gas is introduced into the cavity behind the wafer and escapes through the controlled height slot. The heater power is controlled during this sequence to achieve the desired wafer temperature. When the wafer temperature is correct, which varies depending on process specifications, coating gases are introduced into the chamber and material is deposited on the frontside of the wafer. The sequence described is typical, and may vary to some degree. For example, the heater power may be changed for various reasons, or the purge gas may be on continuously during loading. There are many other changes that may be made in the order of acts to accomplish coating a wafer in the described embodiment, and in other embodiments of the invention.

Figure 12:
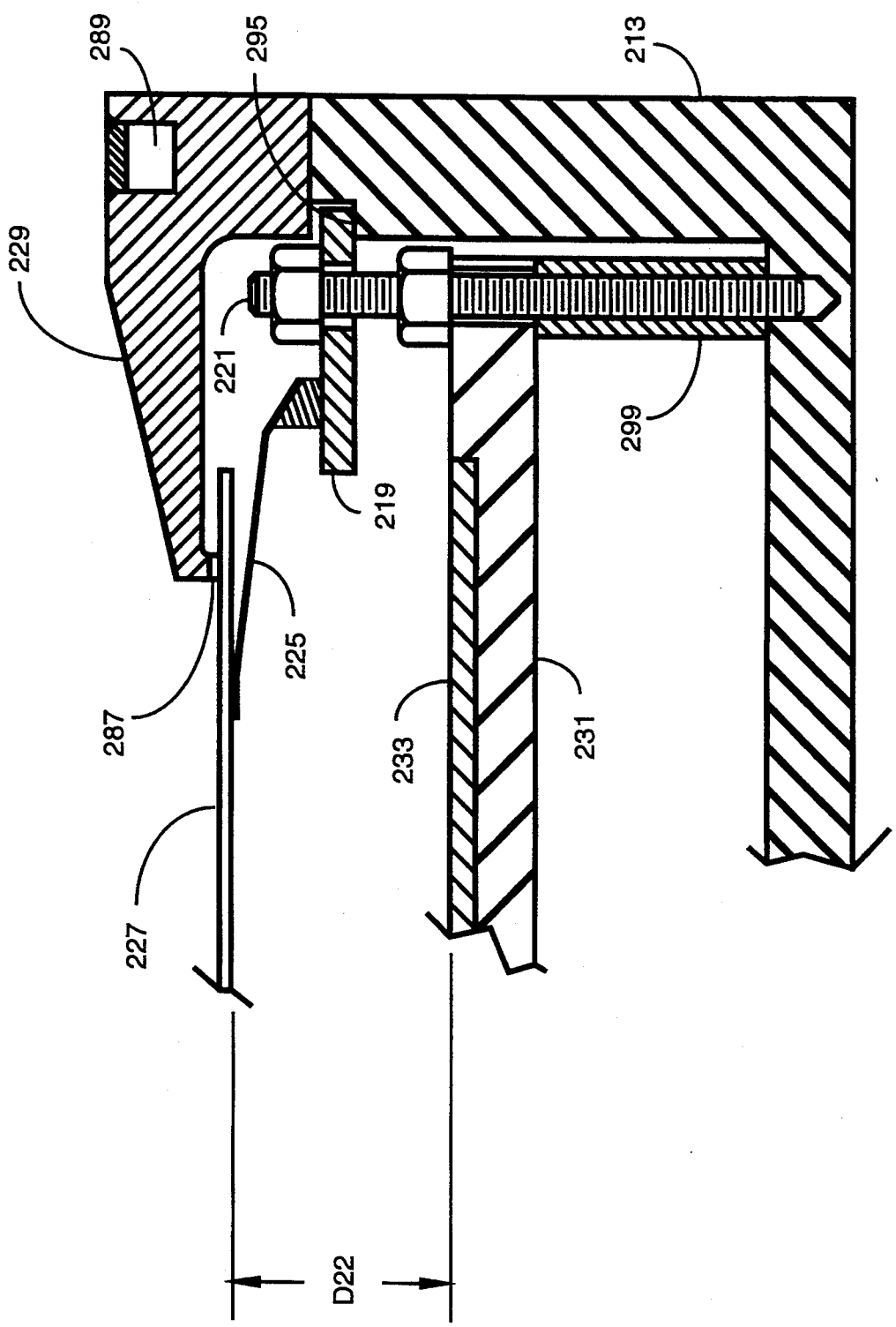
FIG. 12 is an enlarged view of a portion of the apparatus of FIG. 11.

FIG. 12 is a partial section on a radial line through one side of the pedestal, heater plate, support ring and a wafer, at a larger scale than FIG. 11, to better illustrate the relationship between some of the elements of the embodiment of FIG. 11. Wafer 227 is shown supported by a flexible wafer support 225. Clamp ring 229 has three contact extensions for contacting wafer 227, and one extension 287 is shown. The clamp ring also has a water channel 289 for cooling the ring during processing.

Support ring 219 rests in a shoulder 295 machined in the body for that purpose, and is held in position by conventional fastener 221.

Heater plate 231 with pyrolytic graphite heater 233 is spaced from the lower wall of body 213 by cylindrical spacers 299 in this embodiment.

When purge gas is conducted to the backside of the wafer and flows out of the controlled slot, the purge gas behind the wafer is maintained at a higher pressure than the total pressure of the coating gases. This difference in pressure is required to insure that purge gas flows out of the controlled slot into the process chamber, preventing coating gases from flowing through the slot into the cavity behind the wafer. In practice it has been found that a slot height of 0.127 mm (0.005 inches) and an argon purge gas flow of 10 sccm provides excellent protection against edge and backside deposition for silane-reduced selective tungsten deposition. Other processes, such as hydrogen reduced blanket tungsten deposition, may require a smaller slot height or a lesser purge gas flow in order to protect against diffusion of coating gases behind the wafer. This depends on process chemistry, process pressure, and other characteristics.

Distance D22 in this embodiment is about 12.7 mm (0.5 inch) and provides clearance for mounting the wafer supports. It has been found that any distance equal to or greater than ten times the mean free path of the purge gas at the operating pressure of the purge gas is adequate.

Figure 13:
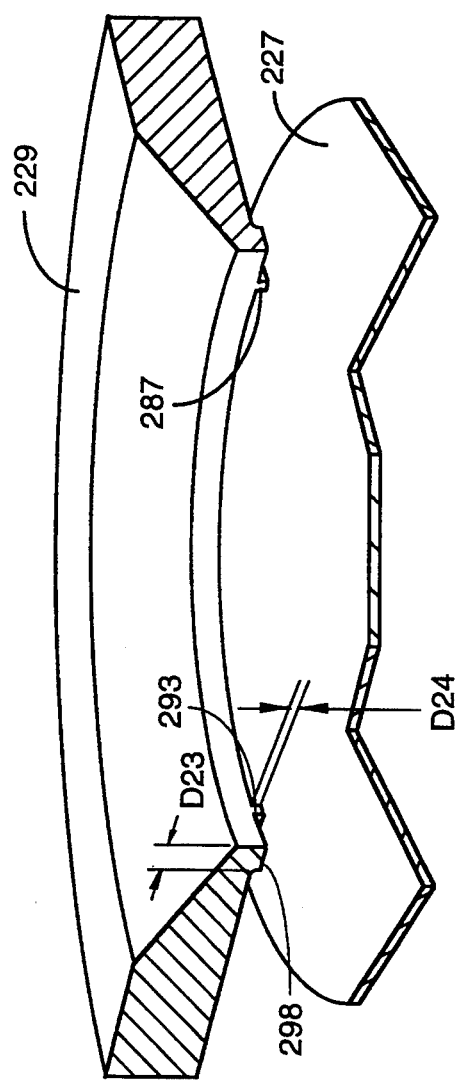
FIG. 13 is an isometric view in partial section showing detail of a clamp ring in the apparatus FIG. 11.

FIG. 13 is a perspective view of clamp ring 229 to better illustrate the geometry that forms a controlled slot between the clamp ring and the wafer. A portion of clamp ring 229 is shown in contact with wafer 227 by two of the contact pads (287 and 293 are shown). The clamp ring has a lip portion 298 of width D23 that forms a surface parallel to the wafer everywhere except at the contact pads. The width D23 of each contact pad is about 1 mm., and the height D24 of each of the contact pads is about 0.127 mm (0.005 inch). The height of the contact pads may be controlled by changing the clamp ring, so different heights may be used for different processes. When the clamp ring is in contact with the wafer there is a controlled slot of 0.127 mm height nearly all the way around the wafer periphery. Purge gas delivered to the backside of the wafer passes through this slot in this embodiment.

The present invention is useful for known CVD processes such as selective tungsten, blanket tungsten, and others, and purge gas flow may be adjusted to accommodate processes of any pressure from below 1 Torr to atmospheric pressure. To exclude coating gases from diffusing through the slot to the edge and backside of a wafer in process, it is preferable that the slot height (D24 in FIG. 13) in combination with the flow rate of purge gas, provides an impulse (mass times velocity) for the purge gas in the slot greater than the impulse of the coating gas diffusing in the opposite direction. It is also preferable that the radial extent of the slot (D23 in FIG. 13) be at least ten times the mean free path of the coating gas in the slot.

In the embodiment described with reference to FIG. 11, the coating apparatus of the invention is a single-station apparatus coating one wafer per processing cycle. It is not required that the apparatus be a single-station apparatus, however. The arrangement of the invention may also be applied to systems with more than one station so that more than one wafer may be coated per processing cycle.

In an alternative embodiment to the one shown in FIG. 11, the flexible wafer supports have an insulator button to insulate the metal spring from the wafer.

There are many changes that may be made in the apparatus of the embodiment described with reference to FIG. 11 without departing from the spirit and scope of the invention. Some have already been described, such as a multi-station machine instead of a single-station apparatus. A single-station apparatus has been tested for wafers of nominal 150 mm diameter. Scaling of parts of the system allows stations to be built for wafers of other sizes as well. In the mode described there are three flexible wafer supports and three contact points for the clamp ring, but there could be more than three of either. For a larger diameter wafer, for example, four supports might provide more stability. There are a number of choices for materials for various of the elements in the preferred embodiments as well. For example, there are several materials suitable for the flexible support members with a requirement being an ability to temper the material to provide spring action, and an ability of the tempered material to retain spring action under the heated conditions of CVD processing. As another example, the clamp ring can be fashioned of quartz, which is an advantage in selective tungsten processing.

Figure 14:
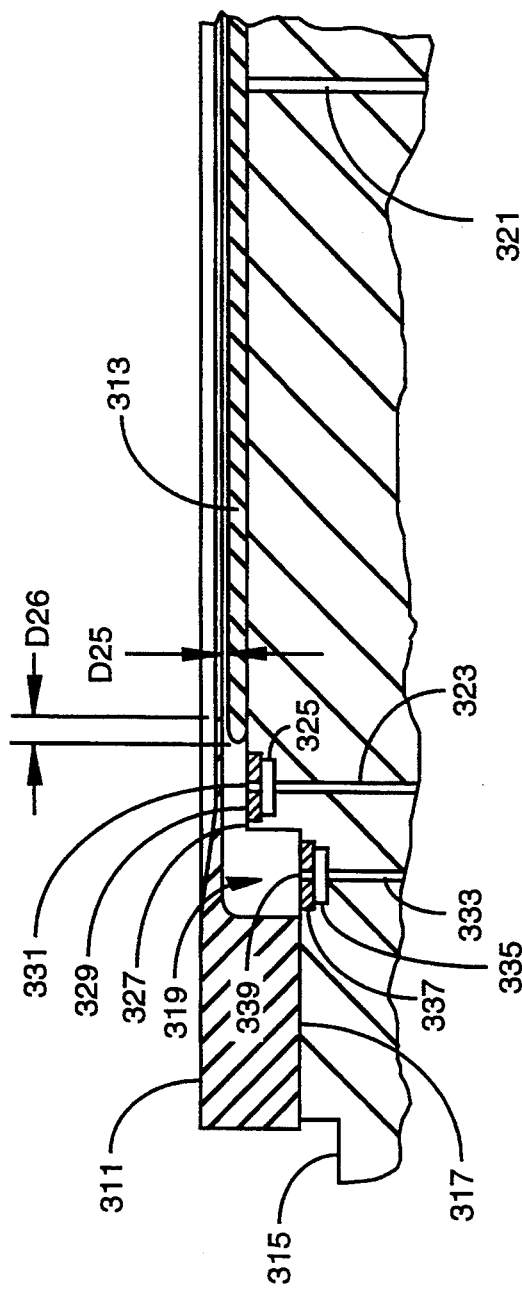
FIG. 14 is an elevation section view showing another embodiment of the invention.

FIG. 14 is an elevation section view of an embodiment of the invention similar to the embodiment of FIG. 5, showing an alternative embodiment of the invention useful to prevent edge and backside coating on wafers in cases where contact between the seal ring and the frontside of the wafer would result in unacceptable loss of otherwise coated and usable area around the periphery of the wafer, or contact between the seal ring and the wafer during coating might result in contiguous coating between the seal ring and the wafer that would fracture when the ring is withdrawn, causing particulate formation.

In the embodiment of FIG. 14 a seal ring 311 is shown in closed position surrounding a wafer 313 to be coated, with the wafer in contact with a wafer chuck 315. In this case the seal ring is not in contact with the wafer, but is in contact with the chuck on a surface 317 at a different level than the surface supporting the wafer. The seal ring forms a slot around the periphery of the wafer with a height D25 of from about 0.125 mm to about 0.200 mm. and a width dimension D26 of about 1.5 mm.

D25 may be smaller than 0.125 mm as long as there is no actual contact between the wafer and the seal ring with the seal ring in the closed position, but the realities of tolerances on wafer thickness make it impractical to establish a slot height less than about 0.1 mm. Under that circumstance, there will be a high probability that some wafers will be contacted by the seal ring. It is desirable that the slot height be as small as practical to minimize diffusion of coating gases through the slot into region 319, so the slot height is kept near the minimum dimension consistent with tolerance on wafer thickness.

Dimension D26 is likewise preferably kept to a minimum to expose the maximum surface area around the outer perimeter of the wafer to coating gases. In this case the dimension is governed by such factors as tolerance on wafer diameter and accuracy of wafer placement on the chuck surface.

In the embodiment shown by FIG. 5 the slot is at the wafer periphery, rather than at the chuck as in some previously described embodiments. With no contact at the wafer perimeter, the seal ring cannot hold the wafer against the chuck. To hold the wafer against the chuck in this embodiment, since the seal ring does not make contact with the wafer, a passage 321, connected to a vacuum pumping system (not shown), opens behind the wafer.

In the preferred mode for this embodiment there is a single passage opening behind the wafer, although there could be more placed in a variety of patterns. To facilitate loading and unloading of wafers, there may be support pins in the chuck face, although the pins are not required for practicing the invention. In an alternative embodiment the vacuum line is activated while loading so the wafer is held at all times between loading and unloading by differential pressure.

Purge gas is delivered to region 319 in this embodiment through passages such as passage 323 through the chuck. To facilitate a substantially even distribution of purge gas to region 319, a two-level circumferential groove 325 is machined in face 327 of the vacuum chuck, and face 327 is machined to be sufficient in circumference to accommodate this groove. A distribution insert ring 329 is inset into the upper region of groove 325 to be level with face 327 of the chuck, and the inset ring has holes, such as hole 331, substantially equally spaced around the circumference, to distribute the purge gas around the circumference near the edge of the wafer.

Purge gas delivered to region 319 is delivered at a rate to maintain the pressure in region 319 at a higher pressure than the total pressure in the process chamber during coating, so there is a flow of purge gas from region 319 into the processing chamber through the slot at the periphery of the wafer.

In a preferred mode of operation for the embodiment shown in FIG. 14, the flow of purge gas is maintained at a magnitude such that the impulse of the purge gas into the chamber is greater than the impulse of coating gas diffusing in the opposite direction toward region 319.

It has been recognized in practice that there is sometimes difficulty in controlling the flow of purge gas into region 319 in a manner to provide stable operation. Accordingly, in the preferred embodiment, a facility is provided for pumping purge gas away from region 319 separate from the escape path through the slot at the periphery of the wafer.

Passage 333 in FIG. 14 is connected to a vacuum pumping system to remove gas from region 319 at a controlled rate, which may be done with a throttle valve in the passage and by other methods known in the art. This removal of gas opposed to the introduction of purge gas allows purge gas to be introduced at a higher pressure and at a higher rate than would otherwise be possible, and provides for more stable pressure control.

A groove 335, similar to groove 325, is machined in face 317 of the chuck, and an insert ring 337 similar to ring 329 is inserted into the upper region of groove 335. Ring 337 also has holes, such as hole 339, substantially equally spaced around the circumference, to extract purge gas at several different points to aid in providing even gas flow. The number of holes, diameter, and spacing needed depends in part on factors such as the slot height, the flow rate of purge gas, and the effective pump-out rate through passage 333. These parameters may vary widely.

Figure 15:
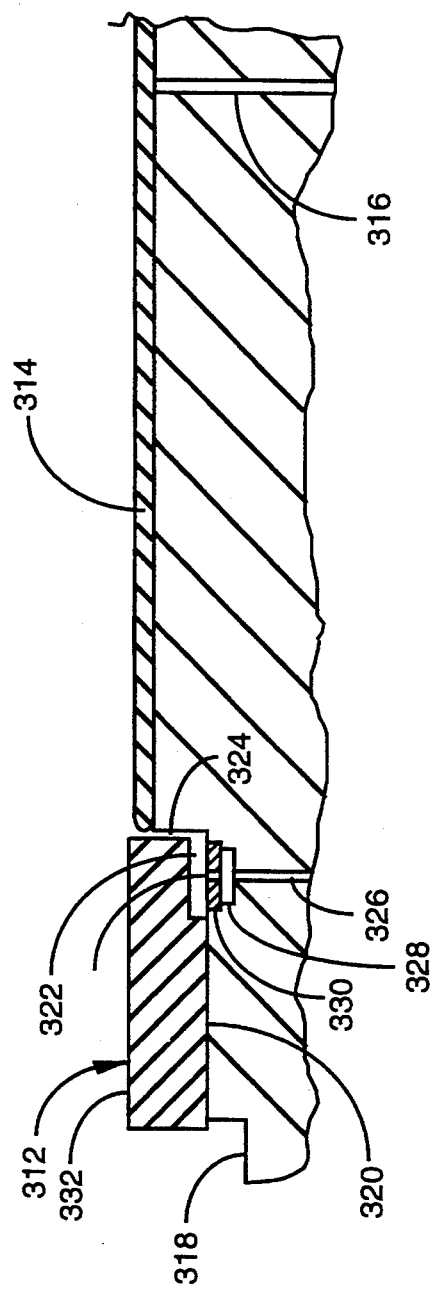
FIG. 15 is an elevation section showing yet another embodiment of the invention.

It is not absolutely required in the embodiment shown with reference to FIG. 14, that the ring overlap the frontside surface of the wafer. FIG. 15 shows an embodiment similar to the embodiment described with reference to FIG. 14, but having a ring 312 that does not overlap the frontside of the wafer. In this embodiment wafer 314 is held against the chuck surface by differential pressure by virtue of a vacuum line 316 that opens through the chuck surface behind the wafer, just as in the embodiment described with the aid of FIG. 14.

Ring 312 contacts chuck 318 on surface 320 and is configured to define an annular cavity 322. The inside diameter of the ring is configured to provide an annular slot 324 proceeding from cavity 322, and purge gas is introduced to cavity 322 through a passage 326 into an annular groove 328, and thence through holes in a distribution ring 330 into cavity 322. From cavity 322 the purge gas escapes through slot 324 past the edge of the wafer, opposing movement of coating gas in the opposite direction.

Top surface 332 of ring 312 can be somewhat lower than the frontside of the wafer in some situations, or can extend substantially above the frontside of the wafer. In alternative embodiments ring 312 may be a part of chuck 318. In other alternatives, further opening into cavity 322 lead to a vacuum pumping system for helping to control the purge gas pressure in cavity 322.

Figure 16:
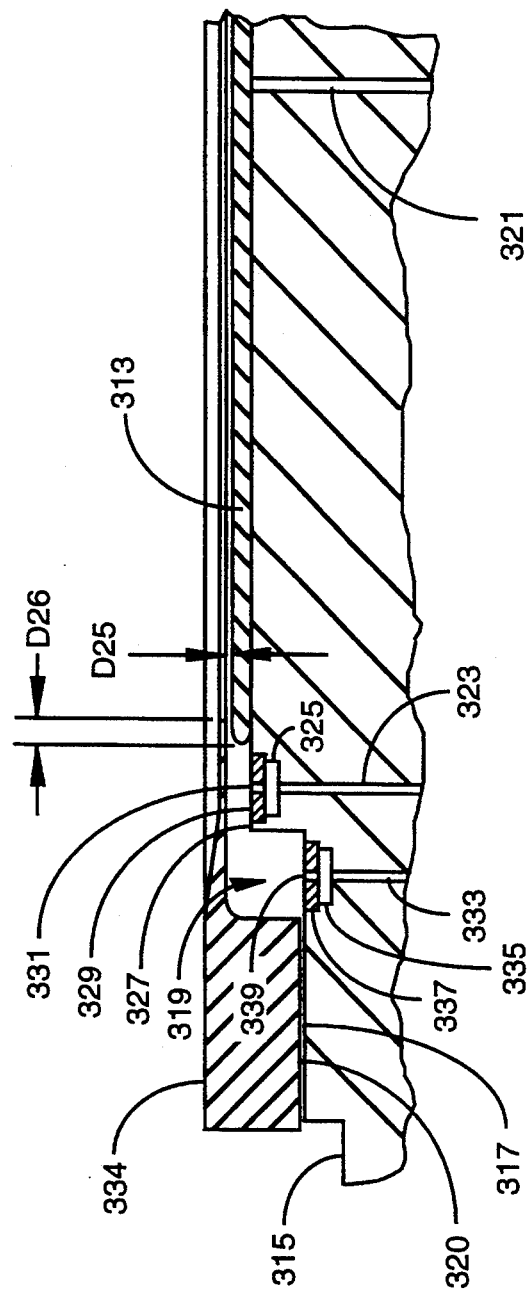
FIG. 16 is an elevation section showing still another embodiment.

FIG. 16 is an elevation view of an embodiment similar to the embodiment shown in FIG. 14, differing by the fact that there is a slot at the chuck as well as at the periphery of the wafer between the frontside of the wafer and the seal ring. In the embodiment shown in FIG. 16, ring 334 is positioned relative to the wafer without contacting the wafer, such as by a stop in the mechanism for advancing and guiding the seal ring. A slot is formed both at the wafer periphery with the frontside of the wafer and between surface 320 on the ring and surface 317 on chuck 315.

FIG. 17A is an elevation section view similar to FIG. 14 showing yet another embodiment of the invention, which is similar in some respects to the embodiment illustrated by FIG. 14 The embodiment of FIG. 17A utilizes flexible extensions from a seal ring to contact the wafer at discrete positions around the periphery to hold the wafer against the chuck, rather than by using vacuum. In FIG. 17A ring 336 has tempered spring extensions, such as extension 341 shown, fixedly attached to the seal ring and extending radially inward, then turning to extend inside the inside diameter of the ring at substantially a right angle to the plane of the ring.

In the view of FIG. 17A seal ring 336 is advanced to make continuous contact with chuck 315. Extension 341 and other such extensions make contact with the wafer before the seal ring contacts the chuck, and deflect, applying pressure to the wafer and urging the wafer against the chuck. When ring 336 contacts the chuck, a slot is left around the periphery of the wafer at the frontside of the wafer.

In a preferred mode for the embodiment shown by FIG. 17A there are three extensions substantially equally spaced around the periphery of the seal ring and attached to the ring. The spring rate and the length of the extensions in the direction toward the wafer is controlled to control the pressure applied at each contact point, and the pressure may be allowed to vary over a wide range. It is preferable to keep the pressure relatively low to avoid damaging wafers, within the constraint of being great enough to prevent the wafer from moving.

In the embodiment shown by FIG. 17A, there is no passage behind the wafer for vacuum, but vacuum may still be used to help control pressure as done in the embodiment shown by FIG. 14. Accordingly, passage 323 for introducing purge gas, and passage 333 for pumping out gas from region 319 are shown in FIG. 17A, and these features may be used in this embodiment.

FIG. 17B shows a view of part of the seal ring and wafer in plan view, in the direction of arrow 343 of FIG. 17A. Width D27 of extension 341 at the seal ring end is about 5 mm., and width D28 at the wafer end of the extension is about 1 mm. The thickness of the extension is about 0.5 mm. These dimensions are exemplary, and it will be apparent to one with skill in the art that there is a broad variation of these dimensions available to a user in practicing the invention, depending on a number of factors, such as the kind of material used for the springs and the temper of the material.

In the embodiment shown by FIG. 17A and 17B the purge gas injection flow and the vacuum withdrawal from the region around the wafer is the same as for the embodiment described with the aid of FIG. 14, where the wafer is held against the chuck by vacuum. It will be apparent to a worker with skill in the art that there are a number of equivalent ways tempered springs may be mounted and used to contact a wafer and urge it against a chuck, and a number of different ways that other kinds of contact elements, such as spring-loaded pins, may be used in a similar manner to accomplish substantially the same purpose.

FIGS. 18A and 18B show yet another embodiment of the invention similar to the embodiment shown in FIG. 17A and 17B. In this embodiment ring 338 is advanced toward chuck 315, and the flexible extensions, such as extension 341, make contact with wafer 313 and urge it against the chuck. Ring 338 does not contact chuck 315 however, as is done in the embodiment shown by FIGS. 17A and 17B. Rather, a stop (not shown) in the mechanism that advances the ring stops the ring before contact is made, so surface 340 of ring 338 remains spaced apart from surface 317 of the chuck, providing a slot through which gas may escape. FIG. 18B is a plan view of a portion of the apparatus of FIG. 18A.

FIG. 19A shows yet another embodiment of the invention, in which a ring 342 is machined to have relatively inflexible "points" around the periphery of the ring on the side toward the wafer, for contacting the wafer and holding it against the chuck. One such point is point 345. FIG. 19B is a broken isometric view showing a portion of the wafer and ring 342 to better illustrate the hold-down points on the ring. In FIG. 18B, point 345 is shown as well as another point 347 at a different position. In a preferred embodiment there are three such points, although there could be more.

Because the hold-down points of the embodiment of FIG. 19A and 19B are relatively inflexible, and it is important that the points contact the wafer to hold the wafer against the chuck, ring 342 is machined to have a thickness such that with the hold-down points in contact with the wafer, a slot of thickness D29 is provided between chuck surface 317 and ring 342. There are, in this embodiment, two slots through which purge gas may escape from region 319, and a relatively higher purge gas flow is thus required. There is no vacuum passage behind the wafer, as the hold-down points on the ring hold the wafer against the chuck, but vacuum passage 333 may still be used to help control purge gas flow by pumping out region 319 against an influx of purge gas.

The embodiment described with the aid of FIGS. 19A and 19B could be implemented as well with flexible wafer supports and a radiant heater as shown for the embodiment of FIG. 11.

One with skill in the art will be aware that there are many variations that may be made in the preferred embodiments described without departing from the spirit and scope of the invention. For example, there are a number of different kinds of gases that could be used as the purge gas. Argon is used in the preferred embodiment, but Nitrogen, hydrogen and some other gases might be suitable. Similarly, there are many ways that a CVD chamber might be constructed and still be equipped to hold a wafer with purge gas flow as disclosed for the various embodiments of the invention. The gas must be conducted to the region around the edge of the wafer, and must flow away from the region opposing the intrusion of coating gas to the edge and backside of the wafer. Various clamp rings and seal rings, and various wafer supports are useful in accomplishing this purpose, and several arrangements have been disclosed.

The invention is also not limited to a particular wafer size. Equipment according to the invention can be built to process wafers of any size that are practical for integrated circuit manufacture.

In the embodiments described wherein purge gas is conducted to an annulus around a wafer formed by the wafer and the seal ring, and continuously withdrawn by use of a vacuum system connected to passages opening into the annular region, there are many ways the gas may be introduced into the annular region, and many manifolding schemes for the vacuum passages as well. Similarly, there are many ways contact pins or extensions may be mounted to the seal ring to contact a wafer and urge it against the chuck. There are many other alterations that might be made without departing from the spirit and scope of the invention.

What is claimed is:

1. An apparatus for preventing coating on the edge and backside of a wafer during processing in a CVD chamber, comprising:
    a wafer support within the chamber for supporting the wafer during processing;
    an enclosure apparatus configured for forming a purge volume around the edge of the wafer substantially separate from the CVD chamber, said enclosure apparatus positionable relative to the wafer to make continuous contact with said wafer support outside the periphery of the wafer and to form a slot of substantially constant height continuously with the frontside of the wafer; and
    a gas supply system for flowing purge gas to said purge volume, providing pressure in said purge volume greater than the pressure in said CVD chamber during CVD processing, causing a flow of purge gas through said slot and into said CVD chamber;
    wherein said wafer support has an opening connecting said purge volume with a vacuum pumping system for extracting purge gas from said purge volume.

2. An apparatus as in claim 1 wherein the enclosure apparatus additionally comprises flexible extensions configured for contacting the wafer on the frontside thereof and within the outer periphery of the wafer.

3. An apparatus for preventing coating on the edge and backside of a wafer during processing in a CVD chamber, comprising:
    a wafer support within the chamber for supporting the wafer during processing;
    an enclosure apparatus configured for forming a purge volume around the edge of the wafer substantially separate from the CVD chamber, said enclosure apparatus positionable relative to the wafer to form a first slot with said wafer support outside the periphery of the wafer and to form a second slot continuously with the frontside of the wafer; and
    a gas supply system for flowing purge gas to said purge volume, providing pressure in said purge volume greater than the pressure in said CVD chamber during CVD processing, causing a flow of purge gas through said slots and into said CVD chamber.

4. An apparatus as in claim 3 wherein said wafer support has a substantially flat surface for contacting the wafer, and said surface has an opening connected to a vacuum pumping system for creating a differential pressure for holding the wafer on said wafer support.

5. An apparatus as in claim 3 wherein said wafer support has an opening connecting said purge volume with a vacuum pumping system for extracting purge gas from said purge volume.

6. An apparatus as in claim 3 wherein the enclosure apparatus additionally comprises attached flexible extensions configured for contacting the wafer on the frontside thereof and within the outer periphery of the wafer.

7. An apparatus as in claim 6 wherein said wafer support is a substantially solid support, and said enclosure apparatus urges said wafer against said wafer support by contact of said attached flexible extensions, holding said wafer against said wafer support.

8. An apparatus as in claim 6 wherein said wafer support has an opening connecting said purge volume to a vacuum pumping system for extracting purge gas from said purge volume.

9. An apparatus as in claim 3 wherein the second slot is formed with the frontside of the wafer by contacting the wafer with substantially solid extensions from the enclosure apparatus, the extensions of a length defining the height of said second slot.

10. An apparatus as in claim 9 wherein said wafer support is a substantially solid support, and said enclosure apparatus urges the wafer against said wafer support by contact of said solid extensions, holding the wafer against said wafer support.

11. An apparatus as in claim 9 wherein said wafer support has an opening connecting said purge volume to a vacuum pumping system for extracting purge gas from said purge volume.

12. A method for preventing edge and backside coating on a wafer during CVD processing in a CVD chamber, comprising the steps of:
    placing a wafer on a wafer support in the CVD chamber prior to commencing CVD processing;
    moving an enclosure means into proximity of said wafer, said enclosure means forming a purge volume around the edge of the wafer by contacting said wafer support continuously outside the periphery of the wafer and forming a slot of substantially constant height continuously with the frontside of the wafer;
    flowing purge gas into the purge volume, past the edge of the wafer, and through the slot during CVD processing, the purge gas directed into the CVD chamber, opposing coating gas flow to the edge and backside of the wafer; and
    pumping purge gas out of said purge volume with a vacuum pumping system connected through a passage through said support means and opening into said purge volume.

13. The method of claim 12 wherein the enclosure apparatus additionally comprises flexible extensions configured for contacting the wafer on the frontside thereof and within the outer periphery of the wafer.

14. A method for preventing edge and backside coating on a wafer during CVD processing in a CVD chamber, comprising the steps of:
    placing a wafer on a wafer support in the CVD chamber prior to commencing CVD processing;
    moving an enclosure means into proximity of said wafer, said enclosure means forming a purge volume around the edge of the wafer having a first continuous slot between the enclosure apparatus and said wafer support outside the periphery of the wafer, and a second slot of substantially constant height continuous with the frontside of the wafer;
    flowing purge gas into the purge volume, past the edge of the wafer, and through the slots during CVD processing, the purge gas directed into the CVD chamber, opposing coating gas flow to the edge and backside of the wafer.

15. The method of claim 14 wherein said wafer support has a substantially flat surface for contacting the wafer, and said surface has an opening connected to a vacuum pumping system for creating a differential pressure for holding the wafer on said wafer support.

16. The method of claim 14 wherein said wafer support has an opening connecting said purge volume with a vacuum pumping system for extracting purge gas from said purge volume.

17. The method of claim 14 wherein the enclosure apparatus additionally comprises attached flexible extensions configured for contacting the wafer on the frontside thereof and within the outer periphery of the wafer.

18. The method of claim 17 wherein said wafer support is a substantially solid support, and said enclosure apparatus urges said wafer against said wafer support by contact of said flexible extensions, holding said wafer against said wafer support.

19. The method of claim 17 wherein said wafer support has an opening connecting said purge volume to a vacuum pumping system for extracting purge gas from said purge volume.

20. The method of claim 14 wherein the second slot is formed with the frontside of the wafer by contacting the wafer with substantially solid extensions from the enclosure apparatus, the extensions of a length defining the height of said second slot.

21. The method of claim 20 wherein said wafer support is a substantially solid support, and said enclosure apparatus urges the wafer against said wafer support by contact of said solid extensions, holding the wafer against said wafer support.

22. The method of claim 20 wherein said wafer support has an opening connecting said purge volume to a vacuum pumping system for extracting purge gas from said purge volume.

23. A system for performing CVD coating on a wafer, comprising;
 a CVD chamber for containing coating gases and said wafer during said coating;
 a wafer support within said CVD chamber for supporting said wafer during coating;
 heating means for heating said wafer to a temperature sufficient to initiate CVD coating;
 an enclosure apparatus configured for forming a purge volume around the edge of the wafer substantially separate from the CVD chamber, said enclosure apparatus positionable relative to the wafer to make continuous contact with said wafer support outside the periphery of the wafer and to form a slot of substantially constant height continuously with the frontside of the wafer; and
 a gas supply system for flowing purge gas to said purge volume, providing pressure in said purge volume greater than the pressure in said CVD chamber during CVD processing, causing a flow of purge gas through said slot and into said CVD chamber;
 wherein said wafer support has an opening connecting said purge volume with a vacuum pumping system for extracting purge gas from said purge volume.

24. A system as in claim 23 wherein the enclosure apparatus additionally comprises flexible extensions configured for contacting the wafer on the frontside thereof and within the outer periphery of the wafer.

25. A system for performing CVD coating on a wafer, comprising;
 a CVD chamber for containing coating gases and said wafer during said coating;
 a wafer support within said CVD chamber for supporting said wafer during coating;
 heating means for heating said wafer to a temperature sufficient to initiate CVD coating;
 an enclosure apparatus configured for forming a purge volume around the edge of the wafer substantially separate from the CVD chamber, said enclosure apparatus positionable relative to the wafer to form a first slot with said wafer support outside the periphery of the wafer and to form a second slot continuously with the frontside of the wafer; and
 a gas supply system for flowing purge gas to said purge volume, providing pressure in said purge volume greater than the pressure in said CVD chamber during CVD processing, causing a flow of purge gas through said slots and into said CVD chamber.

26. A system as in claim 25 wherein said wafer support has a substantially flat surface for contacting the wafer, and said surface has an opening connected to a vacuum pumping system for creating a differential pressure for holding the wafer on said wafer support.

27. A system as in claim 25 wherein said wafer support has an opening connecting said purge volume with a vacuum pumping system for extracting purge gas from said purge volume.

28. A system as in claim 25 wherein the enclosure apparatus additionally comprises attached flexible extensions configured for contacting the wafer on the frontside thereof and within the outer periphery of the wafer.

29. A system as in claim 28 wherein said wafer support is a substantially solid support, and said enclosure apparatus urges said wafer against said wafer support by contact of said flexible extensions, holding said wafer against said wafer support.

30. A system as in claim 28 wherein said wafer support has an opening connecting said purge volume to a vacuum pumping system for extracting purge gas from said purge volume.

31. A system as in claim 25 wherein the second slot is formed with the frontside of the wafer by contacting the wafer with substantially solid extensions from the enclosure apparatus, the extensions of a length defining the height of said second slot.

32. A system as in claim 31 wherein said wafer support is a substantially solid support, and said enclosure apparatus urges the wafer against said wafer support by contact of said solid extensions, holding the wafer against said wafer support.

33. A system as in claim 31 wherein said wafer support has an opening connecting said purge volume to a vacuum pumping system for extracting purge gas from said purge volume.

* * * * *